(12) United States Patent
Hayashi

(10) Patent No.: US 8,298,900 B2
(45) Date of Patent: Oct. 30, 2012

(54) NONVOLATILE SEMICONDUCTOR STORAGE DEVICE WITH CHARGE STORAGE LAYER AND ITS MANUFACTURING METHOD

(75) Inventor: Fumihiko Hayashi, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/317,106

(22) Filed: Oct. 11, 2011

(65) Prior Publication Data

US 2012/0058618 A1     Mar. 8, 2012

Related U.S. Application Data

(63) Continuation of application No. 12/379,509, filed on Feb. 24, 2009, now abandoned.

(30) Foreign Application Priority Data

Mar. 5, 2008  (JP) .................................. 2008-055597

(51) Int. Cl.
*H01L 29/792*     (2006.01)

(52) U.S. Cl. .............. 438/287; 257/E39.309; 257/E29.3; 257/316; 257/315; 257/314

(58) Field of Classification Search .................. 438/287; 257/E39.309, 316, E29.3, 315, 314
See application file for complete search history.

(56) References Cited

U.S. PATENT DOCUMENTS

| 7,005,349 B2 | 2/2006 | Lee et al. |
| 2004/0135192 A1 | 7/2004 | Kasuya |
| 2004/0175886 A1* | 9/2004 | Slotboom et al. ............. 438/257 |
| 2004/0197995 A1* | 10/2004 | Lee et al. ...................... 438/257 |
| 2005/0062091 A1 | 3/2005 | Ding |
| 2006/0086953 A1 | 4/2006 | Lee et al. |

FOREIGN PATENT DOCUMENTS

JP         2004-312009          11/2004

OTHER PUBLICATIONS

Non-final Office Action in U.S. Appl. No. 12/379,509 dated Nov. 26, 2010.
Final Office Action in U.S. Appl. No. 12/379,509 dated Jul. 12, 2011.

* cited by examiner

*Primary Examiner* — Marc Armand
(74) *Attorney, Agent, or Firm* — McGinn IP Law Group, PLLC

(57) ABSTRACT

A method of manufacturing a nonvolatile semiconductor storage device includes sequentially forming a charge storage film, a conductive film, and a mask film on a semiconductor substrate, sequentially removing the mask film, the conductive film, and the charge storage film at a given portion to form a groove, forming a word gate electrode to fill in the groove whose inside is covered with an insulating film, after said forming the word gate electrode, removing the mask film, after said removing the mask film, forming a spacer film to cover the conductive film and the word gate electrode, etching back the spacer film to form a spacer layer on both sides of the word gate electrode through the insulating film, removing the conductive film and the charge storage film to form a control gate electrode, and forming a source drain diffusion layer.

6 Claims, 28 Drawing Sheets

NONVOLATILE SEMICONDUCTOR STORAGE DEVICE WITH CHARGE STORAGE LAYER AND ITS MANUFACTURING METHOD

The present application is a Continuation Application of U.S. patent application Ser. No. 12/379,509, filed on Feb. 24, 2009, now abandoned, which is based on and claims priority from Japanese patent application no. 2008-055597, filed on Mar. 5, 2008, the entire contents of which are incorporated herein by reference.

BACKGROUND OF THE INVENTION

1. Field of the Invention

The present invention relates to a nonvolatile semiconductor storage device and to a method of manufacturing the same, and more particularly to a charge trap type nonvolatile semiconductor storage device and to a method of manufacturing the same.

2. Description of Related Art

As a nonvolatile semiconductor storage device, there has been known a charge trap-type nonvolatile semiconductor storage device. For example, JP-A-2004-312009 (corresponding U.S. Pat. No. 7,005,349B2) discloses a method of manufacturing a silicon-oxide-nitride-oxide-silicon (SONOS) memory device.

FIGS. 1 to 9 are cross-sectional views showing the SONOS memory device manufacturing method in JP-A-2004-312009. First, as shown in FIG. 1, a dielectric layer 111 made of ONO (oxide-nitride-oxide) is formed on a semiconductor substrate 110. Then, a first conductive layer 130a is formed on the dielectric layer 111. Thereafter, a buffer layer 180 is formed on the first conductive layer 130a. Then, as shown in FIG. 2, a trench 181 from which a partial surface of the first conductive layer 130a is exposed is formed on the buffer layer 180. Subsequently, as shown in FIG. 3, a first insulating film 117a is so formed as to cover the trench 181.

Then, as shown in FIG. 4, the first insulting film 117a is etched back to form a first insulating spacer 117 on an inner wall of the trench 181. Thereafter, as shown in FIG. 5, an exposed portion of the first conductive layer 130a and a portion of the dielectric layer 111 therebelow are selectively sequentially removed with the first insulating spacer as an etching mask, thereby dividing the first conductive layer 130a and the dielectric layer 111 into two portions, respectively.

Subsequently, as shown in FIG. 6, a gate dielectric layer 115 is formed on the semiconductor substrate 110 exposed by separation of the dielectric layer 111. The gate dielectric layer 115 extends on the first insulating spacer 117 so as to insulate the two first conductive layers 130a from each other so that the two separated first conductive layers 130a below the first insulating spacers 117 are allowed to function as independent gates (control gates 130), respectively. Subsequently, a second conductive layer 120 (word gate 120) embedded in a gap between both side walls of the trench is formed on the gate dielectric layer 115. Then, a capping insulating layer 118 is so formed as to cover the upper portion of the second conductive layer 120.

Then, as shown in FIG. 7, the buffer layer 180 is removed with the first insulating spacer 117 as an etching mask. Subsequently, as shown in FIG. 8, a portion of the first conductive layer 130a which has been exposed by removal of the buffer layer 180, and a portion of the dielectric layer 111 therebelow are selectively sequentially removed with the first insulating spacer 117 as an etching mask to provide the dielectric layer 111 and the first conductive layer 130 (control gate 130) which have been divided into two parts, respectively, as a final pattern.

Then, as shown in FIG. 9, a first diffusion layer 151a is formed on the semiconductor substrate 110 exposed outside of the final pattern (dielectric layer 111) by ion implantation. Then, a second insulating spacer 116 is formed on the side walls of the dielectric layer 111 and the first conductive layer 130 which are the final pattern. Then, a second diffusion layer 151b is formed on the semiconductor substrate 110 by ion implantation with the second insulating spacer 116 as a mask. Thereafter, although being not shown, a second silicide layer is selectively formed on the second diffusion layer 151b, and a third silicide layer is formed on the second conductive layer 120 in a silicide inducing process. The first conductive layer and the second conductive layer are each formed to include a conductive silicon layer.

Also, T. Saito et al., "Hot hole erase characteristics and reliability in twin MONOS device", IEEE non-volatile semiconductor memory workshop, pp. 50-52, 2003 discloses a device of a twin-MONOS structure as a nonvolatile semiconductor memory device of a split gate-type.

With the advanced miniaturization of a memory, various characteristics required for write, erase, disturb, etc. have become increasingly severe. In order to satisfy the characteristics, the controllability of the gate length of the control gate electrode is very important.

SUMMARY

However, in a technique (FIGS. 1 to 9) of JP-A-2004-312009 described above, the controllability of the gate length of the control gate electrode can be deteriorated as has been proved by the inventors' research. Hereinafter, the problem will be described.

FIGS. 10 to 12 are cross-sectional views for explaining the problems on the technique of JP-A-2004-312009. As shown in FIG. 10, in etching for forming a trench 181 in FIG. 2, a buffer layer 180 has its side surface liable to be tapered. That is, a portion of a side surface 180h at the semiconductor substrate 110 side is configured to project toward the trench 181 side by Δ1 from a portion of the top surface side. In this case, as shown in FIG. 11, a first insulating spacer 117 has its side surface 117h inversely tapered in a first insulating spacer 117 formation process shown in FIG. 4. That is, a portion of the side surface 117h at the semiconductor substrate 110 side is configured to be recessed toward the trench 181 side by Δ2 (substantially equal to Δ1) from a portion of the top surface side.

Under the above circumstances, when a first conductive layer 130a (and a dielectric layer 111) is selectively sequentially removed with the first insulating spacer 117 as an etching mask in FIG. 8, there arises the following problem. As shown in FIG. 12, the side surface 117h of the first insulating spacer 117 is inversely tapered, and a width L2 of the first insulating spacer 117 at a bottom surface 117b side is shorter than a width L1 at an top surface 117t side by Δ3 (substantially equal to Δ2) (Δ3=L1-L2). That is, the top surface 117t is configured to project from the bottom surface 117b by Δ3. When the first conductive layer 130 is etched with the above first insulating spacer 117 as a mask, it is conceivable that a width L4 of the first conductive layer 130 at the top surface 130t side varies in a range of from the width L1 of the first insulating spacer 117 at the top surface 117t side to the width L2 at the bottom surface 117b side. That is, a gate length of the control gate 130 is varied. The variation becomes larger as a thickness L3 of the first insulating spacer 117 is thicker. This is because etching ions are liable to go around to the inside of the inverse taper more as a stroke of the etching ions from the top surface 117t of the first insulating spacer 117 to the bottom surface 117b is longer (a thickness L3 is thicker), and the go-around probability is varied.

Further, the magnitude of Δ1 of the taper in FIG. 10 is varied because of the control difficulty. That is, the above variation can occur when the magnitude of Δ1 is varied, or when there is no variation per se. Correspondingly, in a stage of FIG. 12, the above variation can occur when the magnitude of Δ3 in the inverse taper is varied, or when there is no variation per se. Thus, even in this event, in addition to the above case, the width L4 of the first conductive layer 130, that is, the gate length of the control gate 130, is varied. As a result, the memory cells are varied, and various characteristics required for write, erase, disturb, and so on cannot be satisfied, and a manufacture yield is also adversely affected. A technique for suppressing a variation in the gate length of the control gate is desired.

The present invention seeks to solve one or more of the above problems, or to improve upon those problems at least in part.

In one exemplary embodiment, a nonvolatile semiconductor storage device according to the present invention includes a semiconductor substrate, a charge storage layer formed above the semiconductor substrate, a control gate formed above the charge storage layer, a spacer layer formed above the control gate and a word gate formed above a side of the control gate and the spacer layer. A top surface of the spacer layer is lower as the top surface of the spacer layer is farther from the word gate.

In another exemplary embodiment, a nonvolatile semiconductor storage device according to the present invention includes a semiconductor substrate, a charge storage layer formed above the semiconductor substrate, a control gate formed above the charge storage layer, a spacer layer formed above the control gate, and a word gate formed above a side of the control gate and the spacer layer. A width of the spacer layer is narrower as the width of the spacer layer is farther from the control gate.

In yet another exemplary embodiment, a nonvolatile semiconductor storage device according to the present invention includes a semiconductor substrate, a charge storage layer formed above the semiconductor substrate, a control gate formed above the charge storage layer, a spacer layer formed above the control gate and a word gate formed above a side of the control gate and the spacer layer. A height of the spacer layer from a top surface of the control gate is lower as the top surface of the spacer layer is farther from the word gate.

Thus, in the nonvolatile semiconductor storage device according to the present invention, the spacer layer is lowered as the spacer layer is farther from the word gate or is narrower as the spacer layer is farther from the control gate. That is, the side surface of the spacer layer is not of an inversely tapered configuration in which the top surface side is projected from the bottom surface side. Accordingly, in etching with the spacer layer as a mask, the width of the control gate can be controlled by the width of the bottom surface of the spacer layer. In this case, since a variation in the width of the bottom surface of the spacer layer can be kept to a lower degree, a variation in the width of the control gate can be also kept to a lower degree. That is, a variation in the gate length being the width of the control gate can be kept low, thereby making it possible to improve the manufacture yield.

BRIEF DESCRIPTION OF THE DRAWINGS

The above and other purposes, advantages and features of the present invention will become more apparent from the following description of certain exemplary embodiments taken in conjunction with the accompanying drawings in which.

DETAILED DESCRIPTION OF THE EXEMPLARY EMBODIMENTS

The invention will now be described herein with reference to illustrative exemplary embodiments. Those skilled in the art will recognize that many alternative embodiments can be accomplished using the knowledge of the present invention and that the invention is not limited to the exemplary embodiments illustrated for explanatory purposes.

First Exemplary Embodiment

Figure 13:
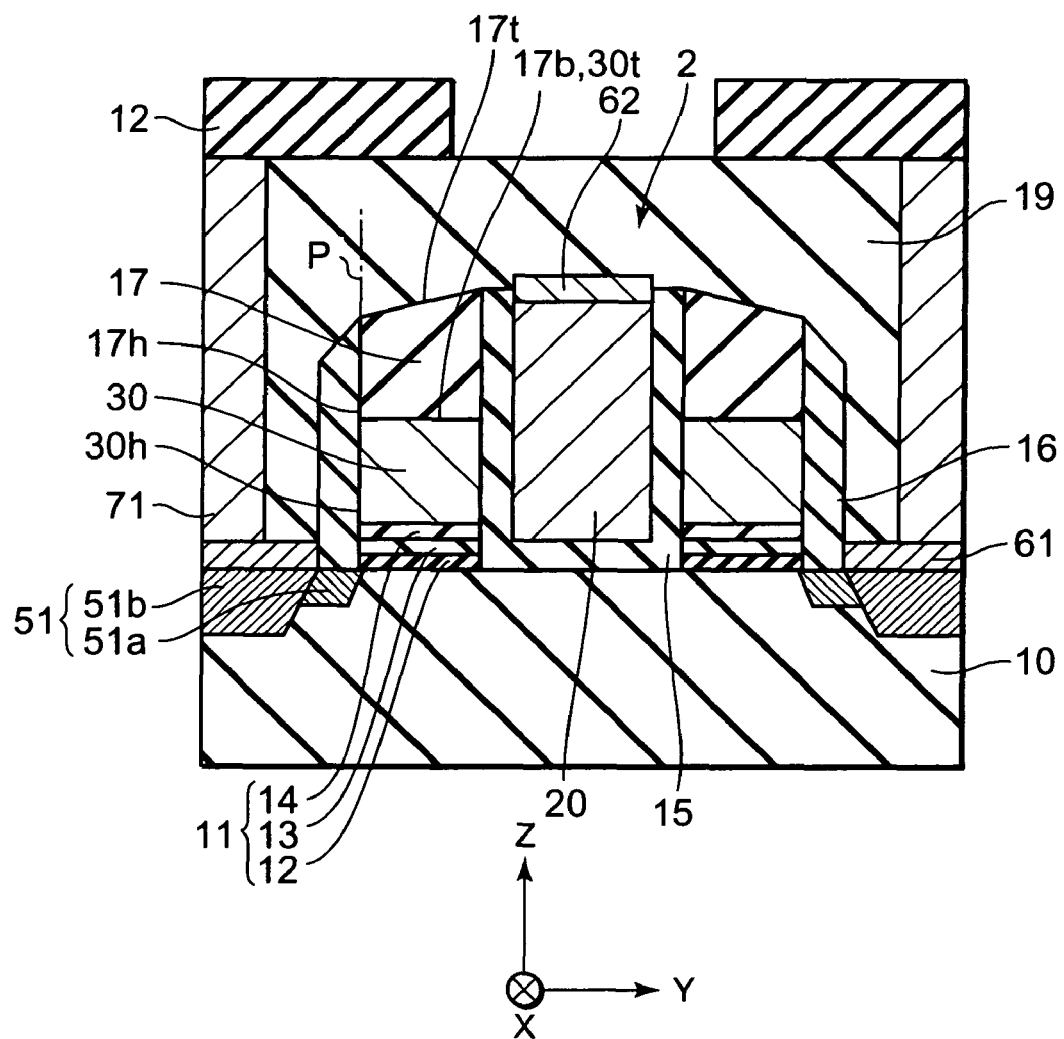
FIG. 13 is a cross-sectional view showing the configuration of a nonvolatile semiconductor storage device according to a first exemplary embodiment of the present invention.

First, a description will be given of the configuration of a nonvolatile semiconductor storage device according to the first exemplary embodiment of the present invention. FIG. 13 is a cross-sectional view showing the configuration of the nonvolatile semiconductor storage device according to the first exemplary embodiment of the present invention. The figure exemplifies a flash memory cell with a TWIN-MONOS structure as a memory cell 2 of the nonvolatile semiconductor storage device according to the first exemplary embodiment.

The memory cell 2 includes a word gate electrode 20, a word gate insulating film 15, a control gate electrode 30, an Oxide Nitride Oxide film: oxide-nitride-oxide (ONO) film 11, a spacer 17, a side wall insulating film 16, a source/drain diffusion layer 51, and silicide layers 61, 62.

The word gate electrode 20 is formed on a channel region (a surface region of the semiconductor substrate 10) through the word gate insulating film 15. The word gate electrode 20 is exemplified by polysilicon doped with impurities. A height of the word gate electrode 20 from the surface of the semiconductor substrate 10 is higher than a height of the control gate electrode 30 from the surface of the semiconductor substrate 10. As a result, when the silicide layer 62 (which will be described later) is formed on the word gate electrode 20, there is no risk that a layer that short-circuits the word gate electrode 20 and the control gate electrode 30 is formed. The word gate electrode 20 may have a top surface side larger in width than a bottom surface side as will be described later. In such a case, since an area of the silicide layer 62 can be widened, the configuration can contribute to low resistance of the silicide layer 62. The silicide layer 62 is formed on an upper portion of the word gate electrode 20. The silicide layer 62 is exemplified by a cobalt silicide.

The word gate insulating film 15 is formed on the channel region sandwiched between the source/drain diffusion layers 51 so as to cover a bottom surface and both side surfaces of the word gate electrode 20. The word gate insulating film 15 is exemplified by silicon oxide. The word gate insulating film 15 has no function of storing electric charges. That is, no electric charges are stored on the bottom surface and the side surfaces of the word gate electrode 20. No ONO film 11 (charge storage layer: described later) is located at the side surfaces of the word gate electrode 20. Instead, the word gate insulating film 15 covers the side surfaces of the word gate electrode 20, thereby making it possible to set a charge storage region to only the ONO film 11 below the control gate electrode 30. As a result, electric charges can locally exist in only the ONO film 11 facing the channel region, thereby increasing the reliability of the operation.

The control gate electrodes 30 are formed on both side surfaces of the word gate electrode 20 through the word gate insulating film 15, and on the channel region through the ONO films 11. The control gate electrodes 30 are exemplified by polysilicon doped with impurities. The top surfaces of the control gate electrodes 30 are substantially parallel to the flat surface of the semiconductor substrate 10, and are substantially flat. In the TWIN-MONOS structure shown in FIG. 13, one memory cell 2 has the two control gate electrodes 30 on both sides of one word gate electrode 20.

Each of the ONO films 11 is a charge storage layer, and formed between the control gate electrode 30 and the channel region. The ONO film 11 may have a three-layer structure including of an oxide film 12, a nitride film 13, and an oxide film 14, which are exemplified by a silicon oxide film, a silicon nitride film, and a silicon oxide film, respectively. As described above, since the ONO film 11 is formed only in a region facing the channel region, the stored charges cannot escape to another region. As a result, it is possible to appropriately transfer electric charges by aid of the control gate electrodes 30 and the word gate electrodes 20.

Each of the spacers 17 is formed on the control gate electrode 30. The spacer layer 17 is exemplified by a silicon nitride film. A height of a top surface 17f of the spacer layer 17 from a bottom surface 17b is lower as the top surface 17f is farther from the word gate electrode 20. Also, a width of the spacer layer 17 is narrower as the spacer layer 17 is farther from the control gate electrode 30. A width of the bottom surface 17b of the spacer layer 17 coincides with a width of a top surface 30t of the control gate electrode 30, and the width of the bottom surface 17b of the spacer layer 17 corresponds to a gate length of the control gate electrode 30. Also, a side surface 17h of the spacer layer 17 at an opposite side of the word gate electrode 20 side is included in a flat surface P or located at the word gate electrode 20 side with respect to the flat surface P on which a side surface 30h of the control gate electrode 30 at an opposite side of the word gate electrode 20 side extends in a direction apart from the surface of the semiconductor substrate 10. That is, the side surface 17h has no inverse taper shown in FIG. 12.

Each of the side wall insulating films 16 is formed so as to cover side surfaces of the control gate electrode 30, the ONO film 11, and the spacer layer 17 at an opposite side of the word gate electrode 20 side. The side wall insulating film 16 is exemplified by a unilaminate silicon oxide film, or a laminate structure including a silicon oxide film, a silicon nitride film, and a silicon oxide film. The respective gate electrodes 30 of the adjacent memory cells 2 are each surrounded by the side wall insulating film 16, and an interlayer insulating layer 19, so as to be insulated from each other.

The source/drain diffusion layers 51 are formed at both sides of the channel region on the surface of the semiconductor substrate 10. Each of the source/drain diffusion layers 51 includes a low-concentration diffusion layer (LDD diffusion layer) 51a and a high-concentration diffusion layer 51b. Each of the low-concentration diffusion layers 51a is formed at a position substantially immediately below the side wall insulating film 16 so as to project from the source/drain diffusion layer 51 to the channel region. The impurities are exemplified by arsenic (As) or phosphorous (P) in the case of n-type conductivity, and exemplified by boron (B) in the case of p-type conductivity. Each of the silicide layers 61 is formed on an upper portion of the source/drain diffusion layer 51. The silicide layer 61 is exemplified by cobalt silicide. An upper portion of each silicide layer 61 is connected with a contact 71, which is further connected to a wiring 72 being an upper layer (exemplification: bit line).

In the present invention, each of the spacer layers 17 becomes lower as it extends farther from the word gate electrode 20. In this case, when the flat surface P substantially perpendicular to the surface of the semiconductor substrate 10 (and a polysilicon film 20a) extends so as to include a line of intersection of the bottom surface 17b and the side surface 17h, the side surface 17h is included in the flat surface P substantially perpendicular to the side surface, or is inclined toward the word gate electrode 20 side.

In other words, the side surface 17*h* is not inclined toward a side apart from the word gate electrode 20 with respect to the substantially perpendicular flat surface P. That is, the side surface 17*h* has no inverse taper shown in FIG. 12. As will be described later, the control gate electrode 30 obtained by etching with the above spacer layer 17 as a mask has the same width as that of the bottom surface 17*b* of the spacer layer 17. That is, the width of the bottom surface 17*b* of the spacer layer 17 can be made to correspond directly to the gate length of the control gate electrode 30. In this example, since the degree of a variation in the width of the bottom surface 17*b* of the spacer layer 17 can be kept low, a variation in the gate length of the control gate electrode 30 is suppressed so as to appropriately execute control, thereby making it possible to improve the manufacture yield.

Figure 14:
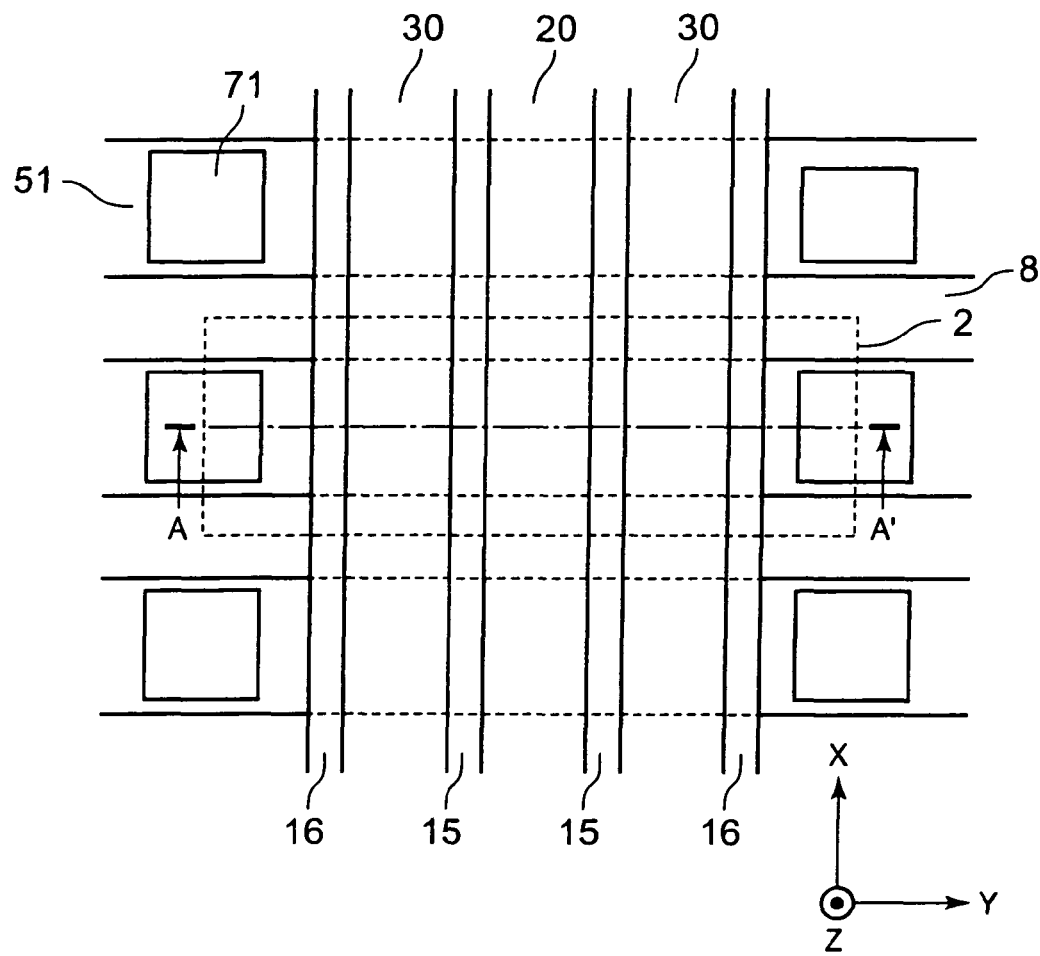
FIG. 14 is a cross-sectional view showing the configuration of a nonvolatile semiconductor storage device according to the first exemplary embodiment of the present invention.

FIG. 14 is a plan view showing the configuration of a nonvolatile semiconductor storage device according to the first exemplary embodiment. In FIG. 14, the silicide layers 61, 62, the interlayer insulating layer 19, and the wiring 72 are omitted.

In the nonvolatile semiconductor storage device, plural memory cells 2 (a region surrounded by a broken line) are aligned in a matrix. A word gate electrode 20 extends in an X-direction, and is shared by the plural memory cells 2 aligned in the X-direction. The control gate electrodes 30 extend along both sides of the word gate electrode 20 through the word gate insulating films 15 in the X-direction, and are shared by the plural memory cells aligned in the X-direction. The word gate electrode 20 and the control gate electrodes 30 also function as wirings.

Also, on the surface of the semiconductor substrate 10 are formed plural device isolation regions 8 that electrically isolate the surface regions from each other, and extend in a Y-direction. The memory cell 2 is a region that is sandwiched between the device isolation regions 8, and includes one word gate electrode 20, the control gate electrodes at both sides of the word gate electrode 20, and regions close to the control gate electrodes 30 (source/drain diffusion layer 51). For example, the memory cell 2 is a region surrounded by a square frame (broken line) in FIG. 14. The memory cell 2 shown in FIG. 13 corresponds to a cross section taken along a line A-A' in FIG. 14. The contact 71 connects the source/drain diffusion layer 51 of the memory cell 2 to a wiring (not shown, exemplification: bit line) arranged on the upper layer.

Subsequently, a description will be given of the operation of the nonvolatile semiconductor storage device according to the first exemplary embodiment with reference to FIG. 13. First, the operation of writing information in the memory cell 2 will be described. A positive potential of about 1 V is applied to the word gate electrode 20, a positive potential of about 6 V is applied to the control gate electrode 30 at a writing side (hereinafter referred to as a "select side"), a positive potential of about 3 V is applied to the control gate electrode 30 at a non-writing side (hereinafter referred to as an "unselect side") paired with the control gate electrode 30, a positive potential of about 5 V is applied to the source/drain diffusion layer 51 at the select side, and about 0 V is applied to the source/drain diffusion layer 51 at the unselect side. As a result, hot electrons that have occurred in the channel region are implanted into the nitride film 13 of the ONO film 11 at the select side. This is called "Channel Hot Electron (CHE) implantation". As a result, data is written.

Subsequently, a description will be given of the operation of erasing information written in the memory cell 2. About 0 V is applied to the word gate electrode 20, a negative potential of about −3 V is applied to the control gate electrode 30 at the writing side, a positive potential of about 2 V is applied to the control gate electrode 30 at the non-writing side, and a positive potential of about 5 V is applied to the source/drain diffusion layer 51 at the select side. As a result, a hole electron pair occurs due to an inter-band tunnelling, and the holes or holes having occurred by colliding with those holes, are accelerated to provide hot holes which are implanted into the nitride film 14 of the ONO film 11 at the select side. As a result, negative charges that have been charged in the nitride film of the ONO film 11 are canceled to erase data.

Subsequently, a description will be given of the operation of reading information written in the memory cell 2. A positive potential of about 2 V is applied to the word gate electrode 20, a positive potential of about 2 V is applied to the control gate electrode 30 at the select side, a positive potential of about 3 V is applied to the control gate electrode 30 at the unselect side, about 0 V is applied to the source/drain diffusion layer 51 at the select side, and about 1.5 V is applied to the source/drain diffusion layer 51 at the unselect side. In that state, a threshold value of the memory cell 2 is detected. When negative electric charges are stored in the ONO film 11 at the select side, the threshold value is increased to more than that in the case where the negative electric charges are not stored. Therefore, the threshold value is detected, thereby making it possible to read information read in the ONO film 11 at the select side. In the memory cell 2 shown in FIG. 13, information of two bits where one bit is provided at each side of the word gate electrode 20 can be recorded.

Subsequently, a description will be given of a method of manufacturing the nonvolatile semiconductor storage device according to the first exemplary embodiment. FIGS. 15 to 28 are cross-sectional views showing respective processes in the method of manufacturing the nonvolatile semiconductor storage device according to the first exemplary embodiment. FIGS. 15 to 28 correspond to a cross section taken along a line A-A' in FIG. 14. Hereinafter, a description will be given of an example in which the word gate electrode 20 and the control gate electrodes 30 are each formed of a polysilicon film.

Figure 15:
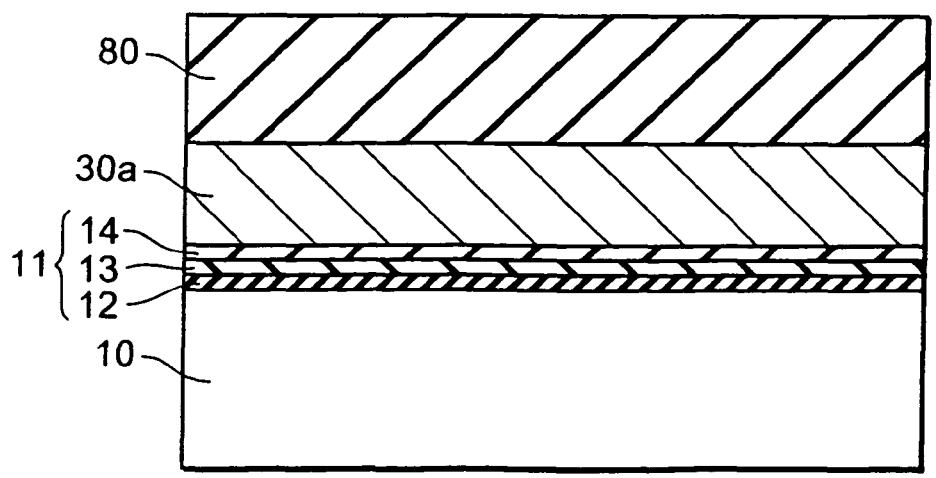
FIG. 15 is a cross-sectional view showing a manufacturing method for a nonvolatile semiconductor storage device according to the first exemplary embodiment of the present invention.

As shown in FIG. 15, on the surface of the semiconductor substrate 10 made of the p-type silicon are laminated a silicon oxide film as the oxide film 12, a silicon nitride film as the nitride film 13, and a silicon oxide film as the oxide film 14 in the stated order. The first silicon oxide film 12 is formed in, for example, a thickness of about 3 to 5 nm through a wet oxidizing method or a radical oxidizing method. The silicon nitride film 13 is formed in, for example, a thickness of about 6 to 10 nm through a chemical vapor deposition (CVD) method. The last silicon oxide film 14 is formed in, for example, a thickness of about 3 to 10 nm through the radical oxidizing, the wet oxidizing or CVD method. As a result, the ONO film 11 functioning as the charge storage layer is formed. Thereafter, a polysilicon film 30*a* is formed so as to cover the ONO film 11 through the CVD method. The polysilicon film 30*a* is formed in, for example, a thickness of about 50 to 200 nm, and doped with In-Situ contained in the film or doped with impurities by ion implantation after the film has been formed. The polysilicon film 30*a* forms the control gate electrodes 30 in a post-process. Then, a silicon nitride film is formed as a mask film 80 through the CVD method so as to cover the polysilicon film 30*a*. The mask film 80 is formed in, for example, a thickness of about 50 to 200 nm.

Figure 16:
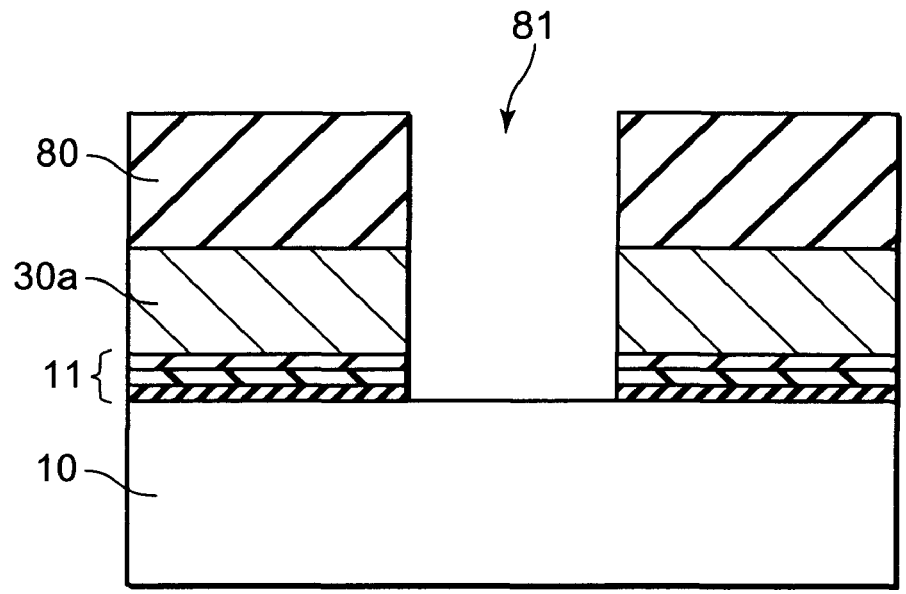
FIG. 16 is a cross-sectional view showing a manufacturing method for a nonvolatile semiconductor storage device according to the first exemplary embodiment of the present invention.

Then, as shown in FIG. 16, a photo resist (not shown) having a pattern of the word gate electrode 20 is formed through a photolithography technique. Then, the mask film 80, the polysilicon film 30*a*, and the ONO film 11 are sequentially dry-etched with the photo resist as a mask to form a trench 81. The word gate electrode 20 is formed within the trench 81 in a post-process. Thereafter, the photo resist is removed.

Figure 17:
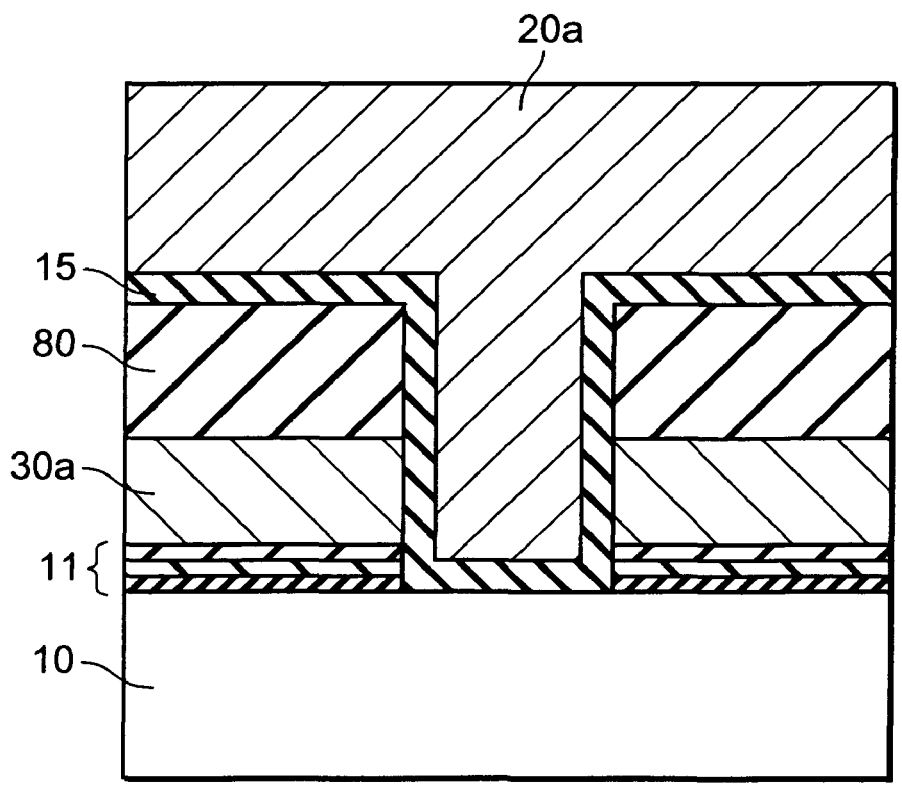
FIG. 17 is a cross-sectional view showing a manufacturing method for a nonvolatile semiconductor storage device according to the first exemplary embodiment of the present invention.

Subsequently, as shown in FIG. 17, the word gate insulating film 15 (silicon oxide) is formed through the CVD method so as to cover the inside of the mask film 80 and the trench 81. The word gate insulating film 15 is formed in, for example, a thickness of about 10 to 30 nm. A width of the trench 81 after the word gate insulating film 15 has been formed corresponds to a gate length of the word gate electrode 20. For example, the width is about 60 to 200 nm. Then, the polysilicon film 20a is formed through the CVD method so as to cover the word gate insulating film 15 and fill in the trench 81. The polysilicon film 20a is formed in, for example, a thickness of about 60 to 200 nm, and then doped with In-Situ impurities contained in the film or doped with impurities by ion implantation after the film has been formed. The polysilicon film 20a forms the word gate electrodes 20 in a post-process.

Figure 18:
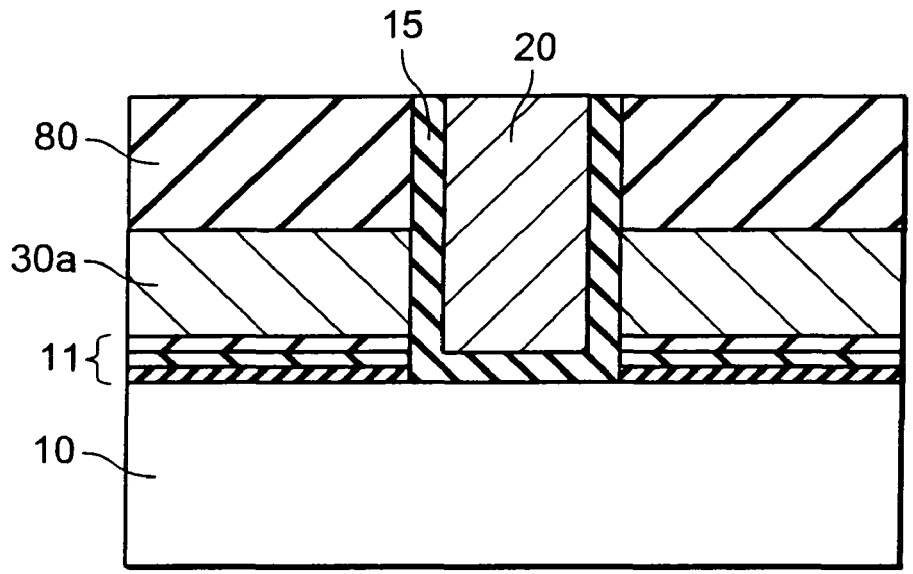
FIG. 18 is a cross-sectional view showing a manufacturing method for a nonvolatile semiconductor storage device according to the first exemplary embodiment of the present invention.
Figure 19:
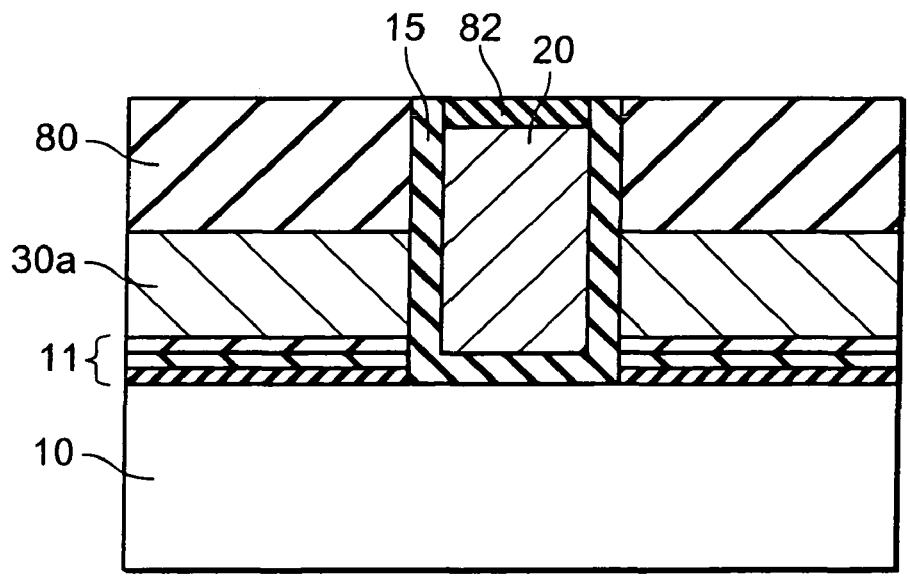
FIG. 19 is a cross-sectional view showing a manufacturing method for a nonvolatile semiconductor storage device according to the first exemplary embodiment of the present invention.
Figure 20:
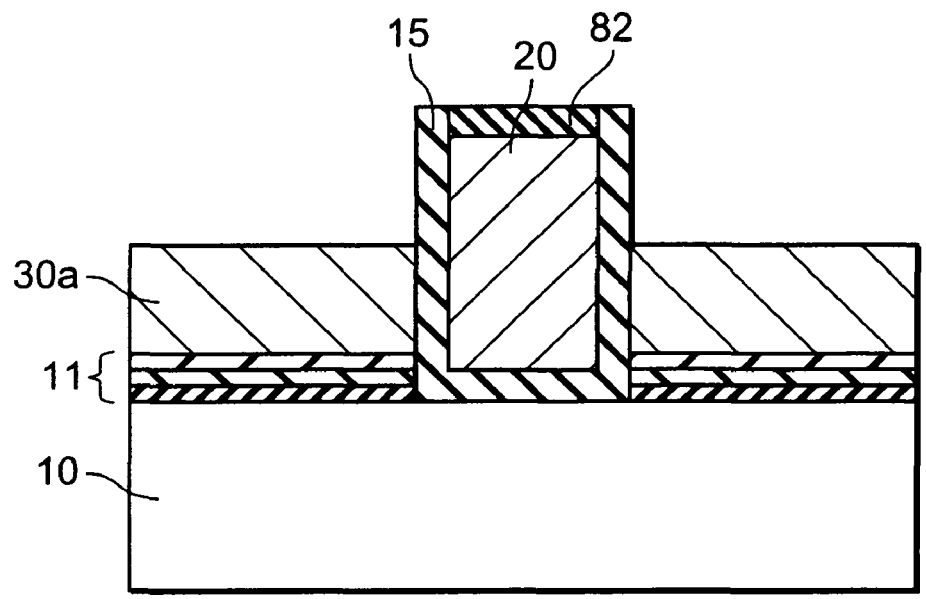
FIG. 20 is a cross-sectional view showing a manufacturing method for a nonvolatile semiconductor storage device according to the first exemplary embodiment of the present invention.

Then, as shown in FIG. 18, the polysilicon film 20a and the word gate insulating film 15 are removed and planarized through etch back or chemical mechanical polishing (CMP) so as to be adjusted to the height of the mask film 80 (remain only within the trench 81). As a result, the polysilicon film 20a forms the word gate electrode 20. Subsequently, as shown in FIG. 19, the upper portion of the word gate electrode 20 is thermally oxidized to form the oxide film 82 in, for example, a thickness of about 10 to 50 nm. Thereafter, as shown in FIG. 20, the mask film 80 is removed by etching. As a result, the upper portion of the word gate electrode 20 whose sides are covered with the word gate insulating film 15 and whose top surface is covered with the oxide film 82 projects from the surface of the polysilicon film 30a.

Figure 21:
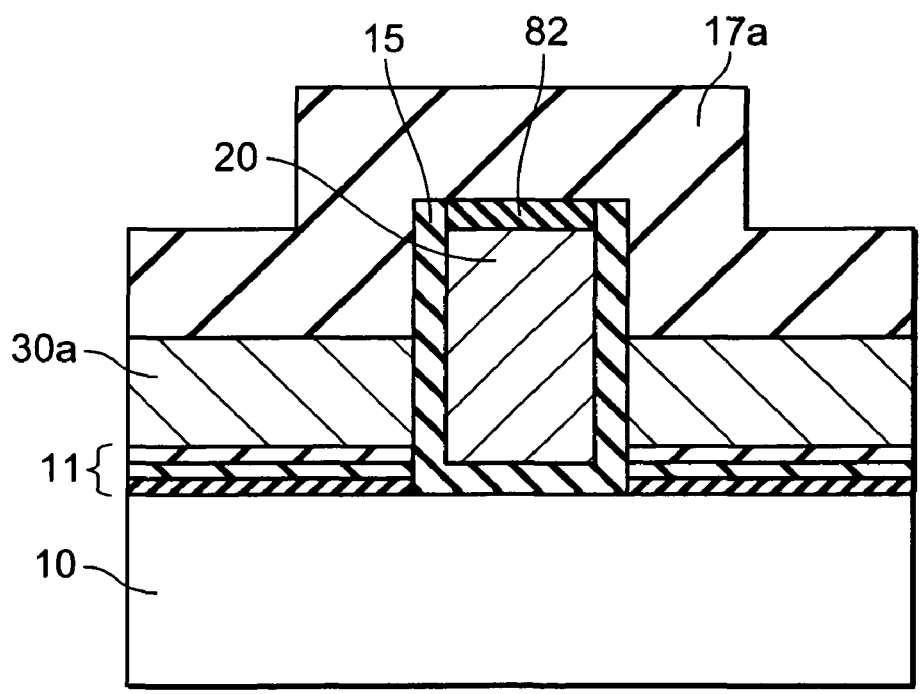
FIG. 21 is a cross-sectional view showing a manufacturing method for a nonvolatile semiconductor storage device according to the first exemplary embodiment of the present invention.
Figure 22:
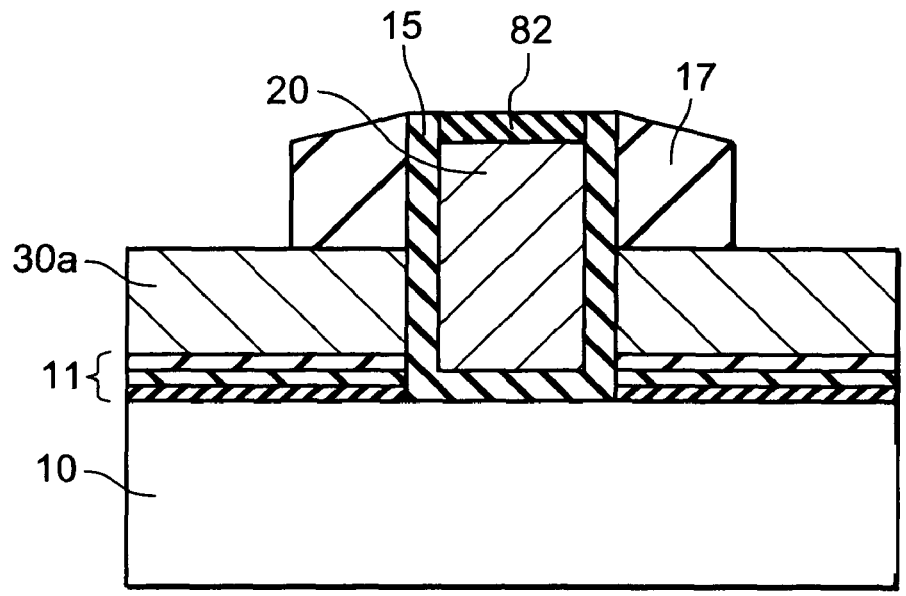
FIG. 22 is a cross-sectional view showing a manufacturing method for a nonvolatile semiconductor storage device according to the first exemplary embodiment of the present invention.
Figure 23:
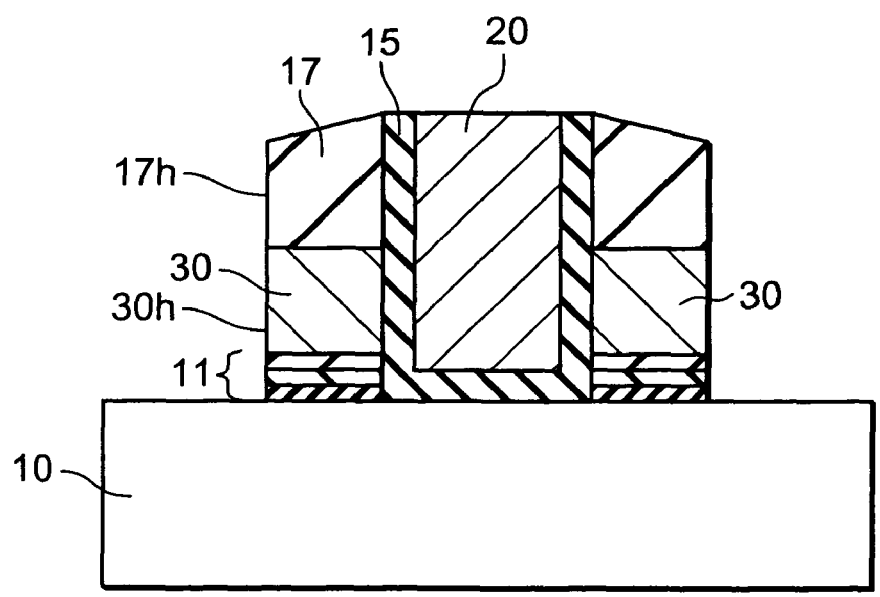
FIG. 23 is a cross-sectional view showing a manufacturing method for a nonvolatile semiconductor storage device according to the first exemplary embodiment of the present invention.

Subsequently, as shown in FIG. 21, a silicon nitride film is formed as a spacer film 17a in, for example, a thickness of about 30 to 100 nm through the CVD method so as to cover the word gate electrode 20 covered with the word gate insulating film 15 and the nitride film 82, and the polysilicon film 30a. Thereafter, as shown in FIG. 22, the spacer film 17a is etched back. As a result, a spacer 17 is formed on the side surface of the word gate electrode 20 through the word gate insulating film 15, and on the surface of the polysilicon film 30a. Then, as shown in FIG. 23, the polysilicon film 30a and the ONO film 11 are sequentially etched with the spacer layer 17 as a mask. As a result, the control gate electrode 30 is formed. The surface of the semiconductor substrate 10 is exposed outside of the control gate electrode 30. At this time, a width of the spacer layer 17 becomes a gate length of the control gate electrode 30.

Figure 24:
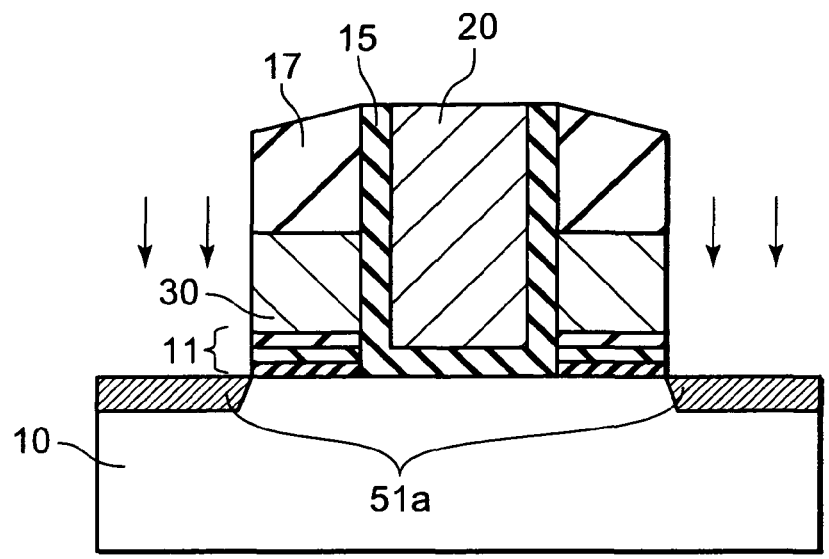
FIG. 24 is a cross-sectional view showing a manufacturing method for a nonvolatile semiconductor storage device according to the first exemplary embodiment of the present invention.
Figure 25:
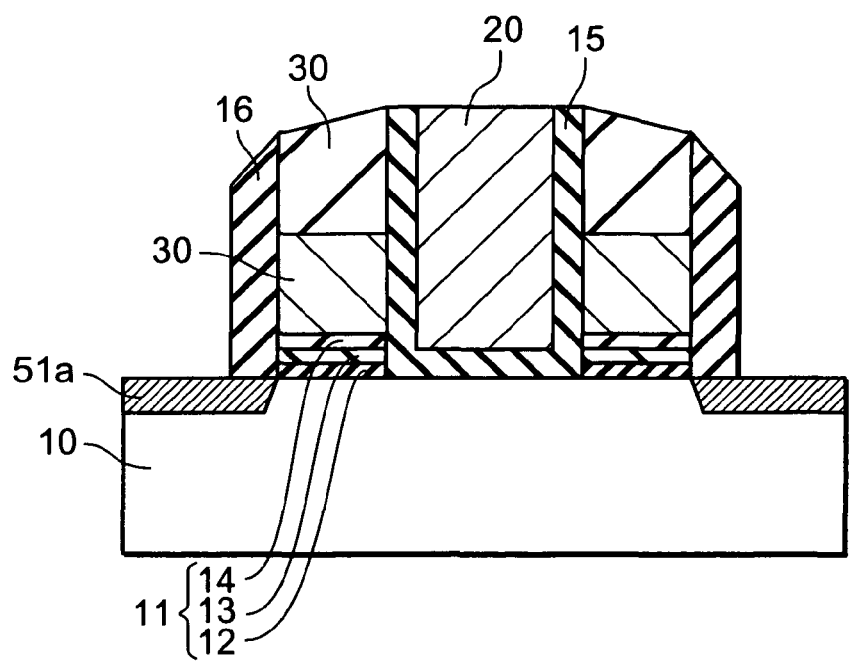
FIG. 25 is a cross-sectional view showing a manufacturing method for a nonvolatile semiconductor storage device according to the first exemplary embodiment of the present invention.
Figure 26:
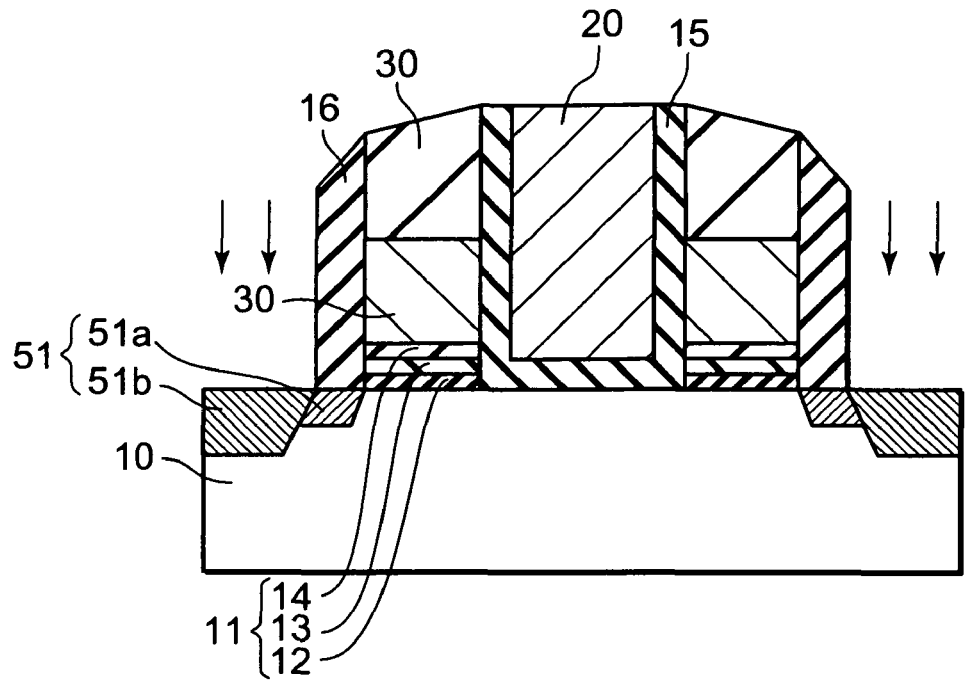
FIG. 26 is a cross-sectional view showing a manufacturing method for a nonvolatile semiconductor storage device according to the first exemplary embodiment of the present invention.

Subsequently, as shown in FIG. 24, impurities are implanted into the surface region of the semiconductor substrate 10 with the spacer layer 17, the word gate electrode 20, and the word gate insulating film 15 acting as a mask, to form a low-concentration diffusion layer 51a. Then, as shown in FIG. 25, a silicon oxide film is formed on the entire surface in a thickness of about 10 to 20 nm through the CVD method, and etched back to form a side wall insulating film 16 on the side surfaces of the spacer layer 17, the control gate electrode 30, and the ONO film 11. Thereafter, as shown in FIG. 26, impurities are implanted into the surface region of the semiconductor substrate 10 with the side wall insulating film 16, the spacer layer 17, the word gate electrode 20, and the word gate insulating film 15 as a mask, to form a high-concentration diffusion layer 51b. The low-concentration diffusion layer 51a and the high-concentration diffusion layer 51b constitute the source/drain diffusion layer 51.

Figure 27:
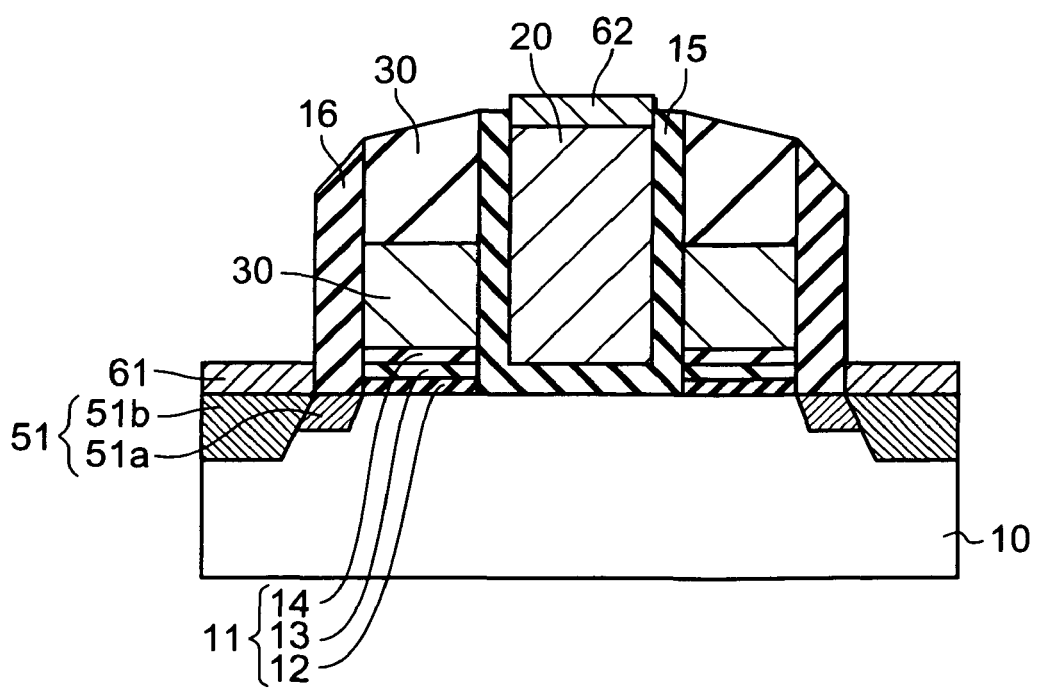
FIG. 27 is a cross-sectional view showing a manufacturing method for a nonvolatile semiconductor storage device according to the first exemplary embodiment of the present invention.
Figure 28:
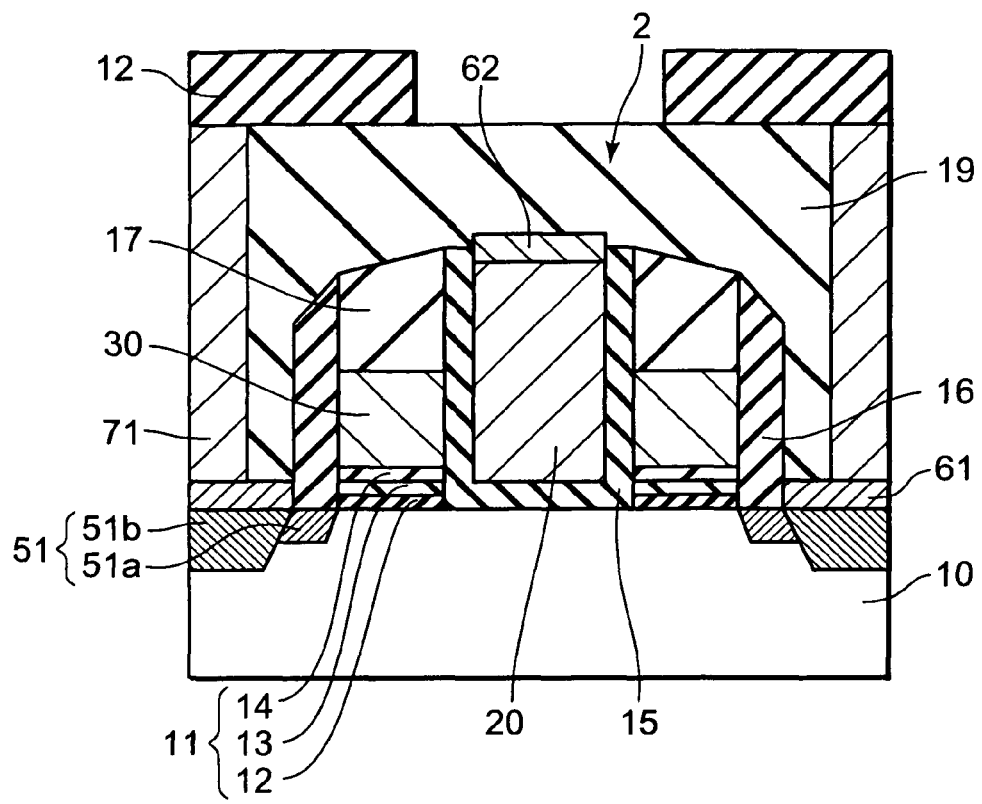
FIG. 28 is a cross-sectional view showing a manufacturing method for a nonvolatile semiconductor storage device according to the first exemplary embodiment of the present invention.

Then, as shown in FIG. 27, a metal film exemplified by cobalt is formed in about 10 nm thickness on the entire surface through the sputtering method to form the silicide layers 62 and 61 on the word gate electrode 20 and the source/drain diffusion layer 51 through a given heat treatment, respectively. Then, as shown in FIG. 28, after the formation of the interlayer insulating layer 19 on the entire surface, the contact 71 that penetrates the interlayer insulating layer 19 is formed on the source/drain diffusion layer to form a wiring 72 on the contact 71.

With the above operation, the nonvolatile semiconductor storage device (FIG. 13) according to the first exemplary embodiment is manufactured.

Figure 29:
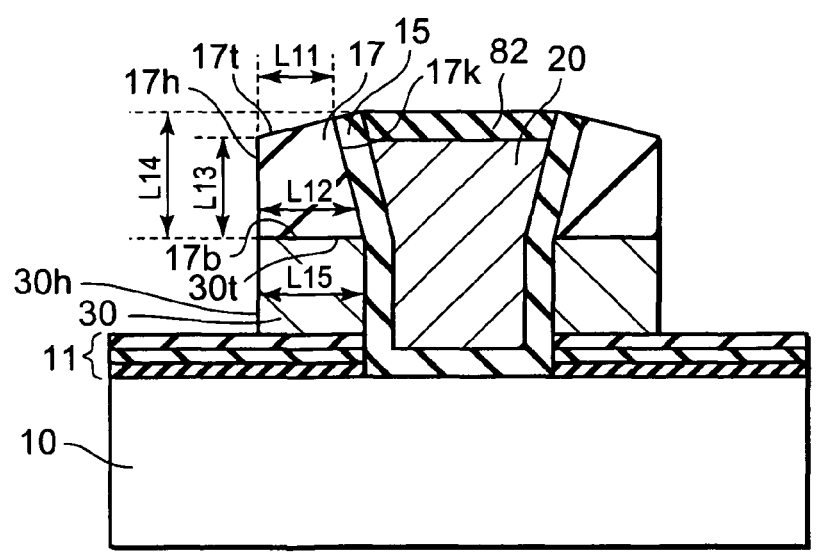
FIG. 29 is a cross-sectional view for explaining the advantages of the nonvolatile semiconductor storage device and the manufacturing method therefor according to the first exemplary embodiment of the present invention.

FIG. 29 is a cross-sectional view for explaining the advantages of the nonvolatile semiconductor storage device and the manufacturing method therefor according to this embedment. FIG. 29 shows the polysilicon film in processes of FIGS. 22 to 23.

The spacer layer 17 is formed by etch back in a process of FIG. 22. Accordingly, in a height of a top surface 17t from a bottom surface 17b of the spacer layer 17 (a surface 30t of the polysilicon film 30a), a height L13 at a side surface 17h at an opposite side of the word gate electrode 20 is lower than a height L14 at a side surface 17k at the word gate electrode 20 side. That is, the height L13 is lower as the side surface 17h is (e.g., extends) farther from the word gate electrode 20. In this situation, when a flat surface substantially perpendicular to the surface of the semiconductor substrate 10 (and the polysilicon film 30a) extends so as to include a line of intersection of the bottom surface 17b and the side surface 17h, the side surface 17h is included in the flat surface substantially perpendicular to the side surface, or inclined toward the word gate electrode 20 side. Accordingly, the side surface 17h is not inclined toward a side apart from the word gate electrode 20 with respect to the substantially perpendicular flat surface. That is, the side surface 17h has no inverse taper shown in FIG. 12.

When the polysilicon film 30a is etched with the above spacer layer 17 as a mask, since no inverse taper exists, the polysilicon film 30a is etched by the width of the bottom surface 17b of the spacer layer 17. As a result, it is possible that a width L12 of the bottom surface 17b of the spacer layer 17 is made to coincide with a width L15 of the top surface 30t of the control gate electrode 30. That is, the width L12 of the bottom surface 17b of the spacer layer 17 can be made to correspond directly to the gate length of the control gate electrode 30. In this case, since the degree of a variation in the width L12 of the bottom surface 17b of the spacer layer 17 can be also kept low, a variation in the gate length of the control gate electrode 30 can be also kept low. That is, it is possible to improve the manufacture yield.

Figure 12:
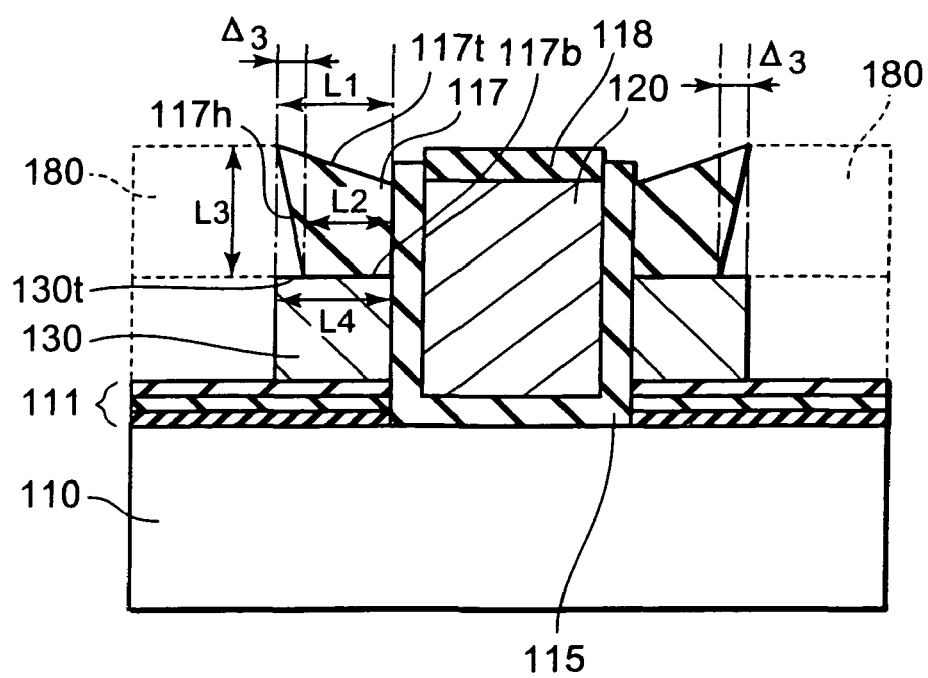
FIG. 12 is a cross-sectional view for explaining problems of the technique of JP-A-2004-312009.

The manufacturing method for the nonvolatile semiconductor storage device according to the first exemplary embodiment is clearly different from the manufacturing method disclosed in JP-A-2004-312009 as shown in FIGS. 15 to 28. For that reason, the spacer layer 17 in the first exemplary embodiment is not inversely tapered as shown in FIG. 12, and the above advantage can be obtained. However, in the manufacturing method for the nonvolatile semiconductor storage device according to the first exemplary embodiment, there is the possibility that the upper configurations of the word gate electrode 20 and the gate insulating film 15 are spread outward as shown in FIG. 29. However, an influence of the spread configuration on the top surface 17t and the side surface 17h of the spacer layer 17 is extremely small, and there arises no problem in the above effect. The reason will be described below.

FIGS. 30 to 34 are cross-sectional views showing a manufacturing process when the upper configuration of the word gate electrode 20 is spread in the manufacturing method for the nonvolatile semiconductor storage device according to the first exemplary embodiment. FIGS. 30 to 34 correspond to FIGS. 16, 20, 21, the mid-flow of FIGS. 21 and 22, and FIG. 22.

Figure 30:
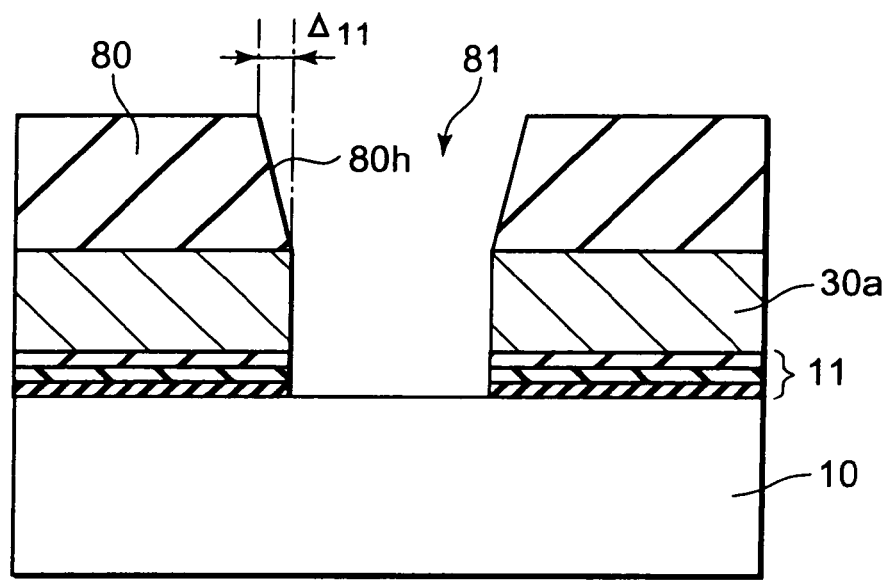
FIG. 30 is a cross-sectional view showing a manufacturing process when an upper configuration of a word gate electrode is spread in the manufacturing method for the nonvolatile semiconductor storage device according to the first exemplary embodiment of the present invention.
Figure 31:
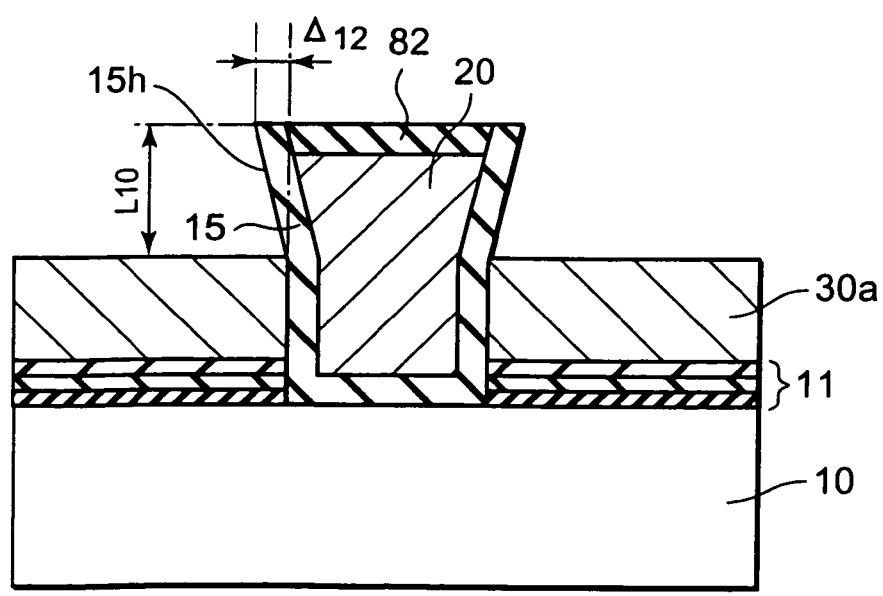
FIG. 31 is a cross-sectional view showing a manufacturing process when an upper configuration of a word gate electrode is spread in the manufacturing method for the nonvolatile semiconductor storage device according to the first exemplary embodiment of the present invention.

As shown in FIG. 30, the mask film 80 has a side surface 80h liable to be tapered in etching for forming the trench 81 in FIG. 16. That is, a portion of the side surface 80h at the top surface side is configured to be recessed toward the mask film 80 side with respect to a portion thereof at the side of the semiconductor substrate 10 by Δ11. In that case, as shown in FIG. 31, the word gate electrode 20 and the word gate insulating film 15 are configured so that their upper portion confirmations are spread outward in a stage of FIG. 20. As a result, an upper side wall 15h of the word gate insulating film 15 is inversely tapered. That is, a portion of the side wall 15h at the side of the semiconductor substrate 10 is configured to be recessed toward the word gate electrode 20 side by Δ12 (substantially equal to Δ11) with respect to a portion thereof at the top surface side. In this case, it is assumed that a height of the inversely tapered portion of the side wall 15h is L10.

Figure 32:
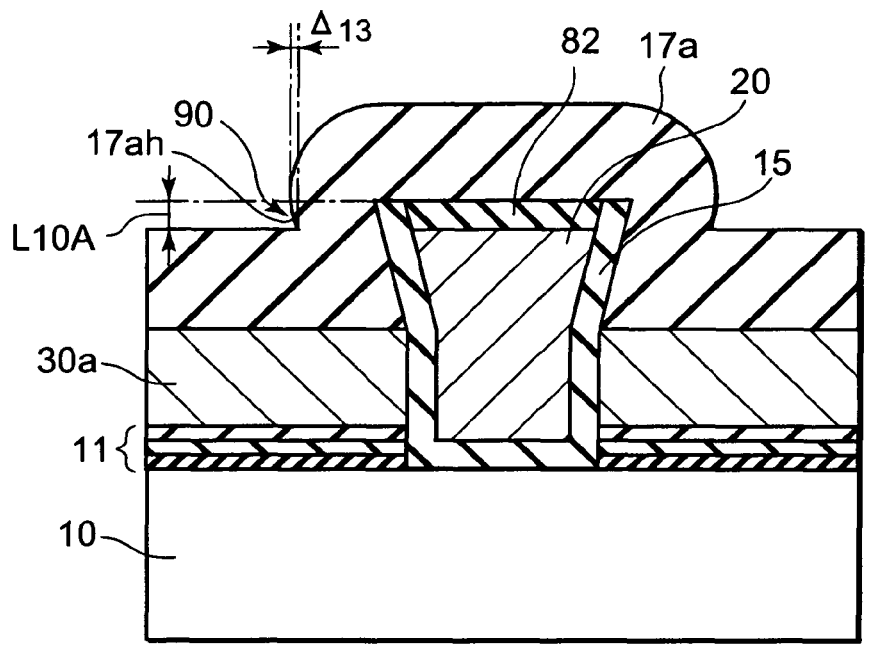
FIG. 32 is a cross-sectional view showing a manufacturing process when an upper configuration of a word gate electrode is spread in the manufacturing method for the nonvolatile semiconductor storage device according to the first exemplary embodiment of the present invention.

In the above state, when the spacer film 17a is formed so as to cover the word gate electrode 20 and the polysilicon film 30a in a process of FIG. 21, the spacer film 17a has its upper configuration spread outward along the configurations of the word gate electrode 20 and the word gate insulating film 15, as shown in FIG. 32. As a result, an upper side wall 17ah of the spacer film 17a is inversely tapered. That is, a portion of the side wall 17ah at the side of the semiconductor substrate 10 is configured to be recessed toward the word gate electrode 20 side by Δ13 with respect to a portion at the top surface side. However, a recess 90 being an inversely tapered portion is of no configuration tracing the configuration of the upper side wall 15h of the word gate insulating film 15 as it is, but of a slightly dulled configuration so as to be reduced more than L10 by the thickness of the spacer layer 17a. That is, when it is assumed that a height of an inversely tapered portion of the side wall 17ah is L10A, L10A<L10 as well as Δ13<Δ12 is satisfied. In this way, the formation of the spacer film 17a whose configuration of the outer surface is free enables an influence of the inverse taper to be suppressed.

Figure 33:
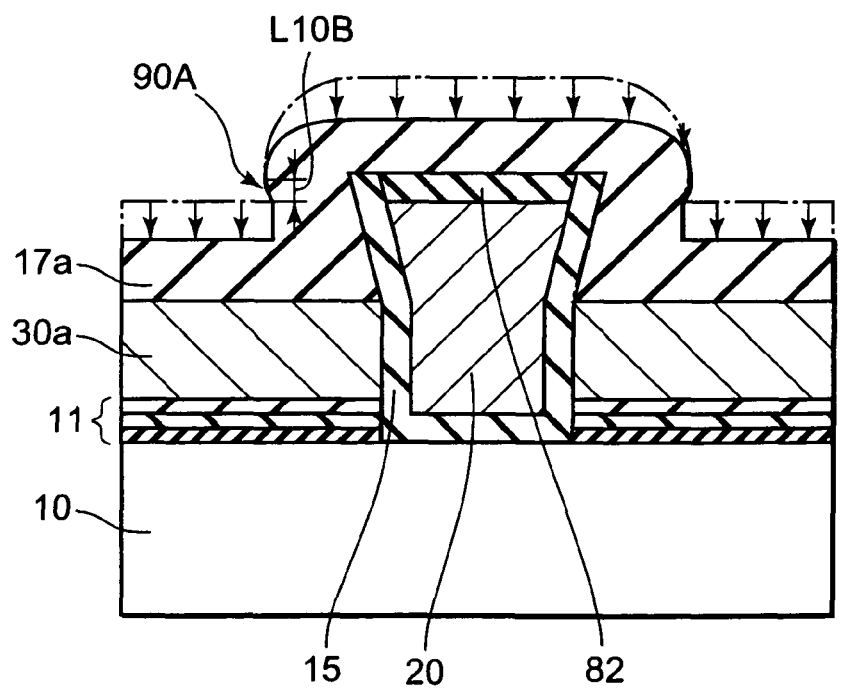
FIG. 33 is a cross-sectional view showing a manufacturing process when an upper configuration of a word gate electrode is spread in the manufacturing method for the nonvolatile semiconductor storage device according to the first exemplary embodiment of the present invention.
Figure 34:
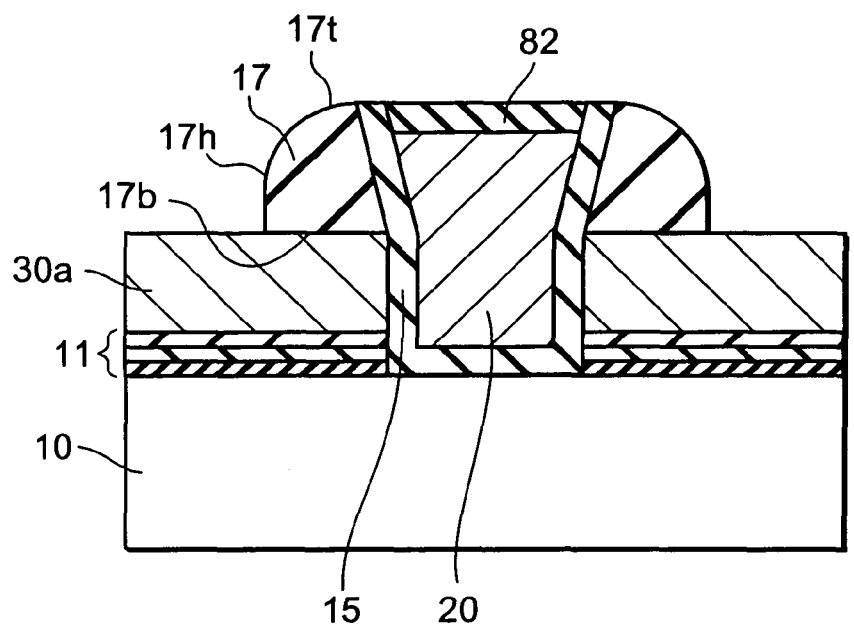
FIG. 34 is a cross-sectional view showing a manufacturing process when an upper configuration of a word gate electrode is spread in the manufacturing method for the nonvolatile semiconductor storage device according to the first exemplary embodiment of the present invention.

Besides, in this state, when the spacer film 17a is etched back in a process of FIG. 21, the spacer film 17a is etched by etching ions that are input substantially perpendicularly to the surface of the semiconductor substrate 10, as shown in FIG. 33. In this situation, the spacer film 17a is etched in the substantially perpendicular direction with the substantially same thickness over the entire surface of the semiconductor substrate 10. As shown in FIG. 33, the spacer film 17a initially having a configuration indicated by a broken line is etched in the substantially perpendicular direction with the substantially same thickness over the entire surface into a configuration indicated by a solid line. In this situation, a recess 90A of the inverse taper is reduced smaller than the recess 90, and a height L10B of the inversely tapered portion is also smaller than the height L10A. Then, when the height L10A of the inversely tapered portion during the initial phase of etch back is smaller than the etch back quantity of the spacer film 17a, the inversely tapered portion at the side wall 17h can be eliminated finally as shown in FIG. 34. Even if the height L10A of the inversely tapered portion during the initial phase of etch back is larger than the etch back quantity of the spacer film 17a, it is possible to further reduce the size of the recess 90A, and the height of the inversely tapered portion can be further reduced more than L10A. As a result, it is possible to remarkably suppress an influence of the inverse taper.

In this way, since the inversely tapered portion is finally eliminated or remarkably reduced, it is possible to substantially ignore the inversely tapered portion with respect to the intended spacer layer 17. Accordingly, even if the spacer layer 17 is used as an etching mask of the polysilicon film 30a, it is conceivable that etching is hardly affected by the inverse taper of the word gate electrode 20. That is, when the polysilicon film 30a is etched, etching ions reach the polysilicon film 30a while their courses are restricted by the top surface 17t and the side wall 17h of the spacer layer 17. In this situation, because the inversely tapered portion hardly exists, there is no case in which etching ions go round to that portion. Accordingly, it is possible to etch the polysilicon film 30a with a width predetermined by the top surface 17t and the side wall 17h. Accordingly, it is possible to form the control gate electrode 30 with the width predetermined by the top surface 17t and the side wall 17h.

Also, even if the inversely tapered portion remains, and etching ions go around to that portion for etching, because a width of that portion is extremely small, its influence is similarly extremely small, and the control gate electrode 30 can be formed with a width that is rarely different from the width predetermined by the top surface 17t and the side wall 17h. Further, there is a risk that etching ions do not go around to the inversely tapered portion, or go around thereto, thereby causing the width of the control gate electrode 30 to be varied. However, as described above, because the height of the inversely tapered portion is smaller than L10A (than L10), the control gate electrode 30 can be formed with a width that is rarely different from the width predetermined by the top surface 17t and the side wall 17h regardless of the presence or degree of go-around of etching ions. Accordingly, there arises no problem on a variation in the width of the control gate electrode 30.

As described above, in the present invention, the height of the inversely tapered portion can be more surely decreased as compared with the case of JP-A-2004-312009. Further, the film thickness of the spacer layer 17a, the height (=L10) of the mask film 80, and the etch back quality are appropriately set, thereby enabling the occurrence of the inversely tapered portion to be finally removed.

Figure 1:
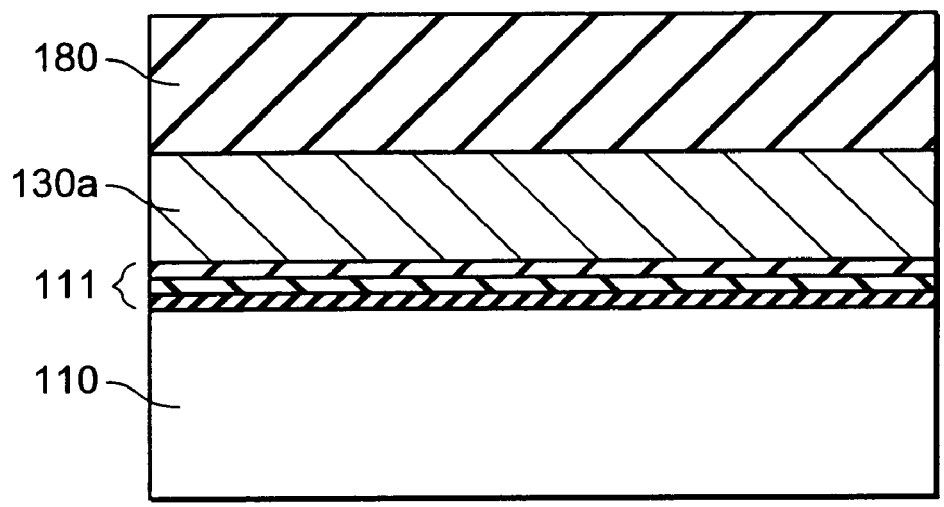
FIG. 1 is a cross-sectional view showing a manufacturing method of JP-A-2004-312009.
Figure 2:
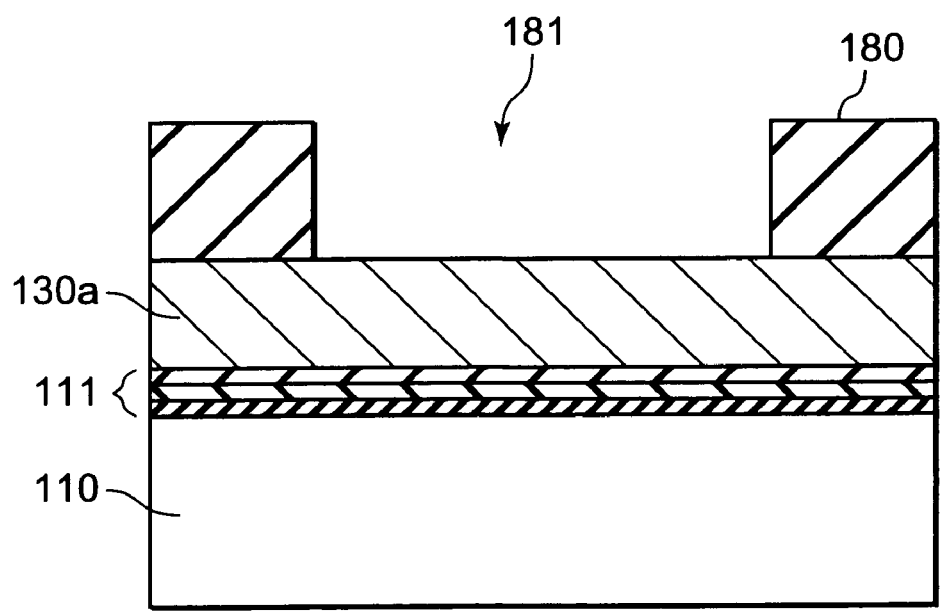
FIG. 2 is a cross-sectional view showing a manufacturing method of JP-A-2004-312009.
Figure 3:
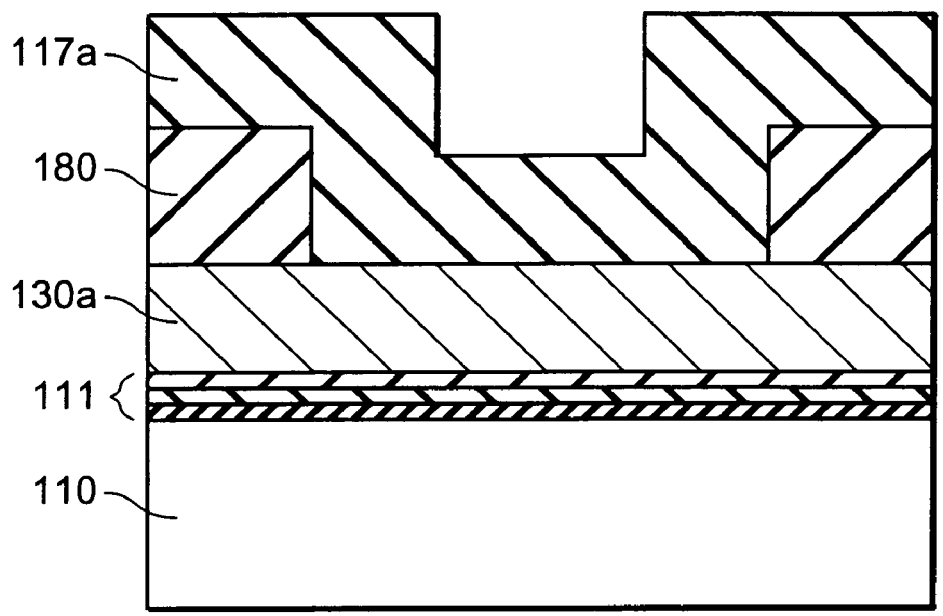
FIG. 3 is a cross-sectional view showing a manufacturing method of JP-A-2004-312009.
Figure 4:
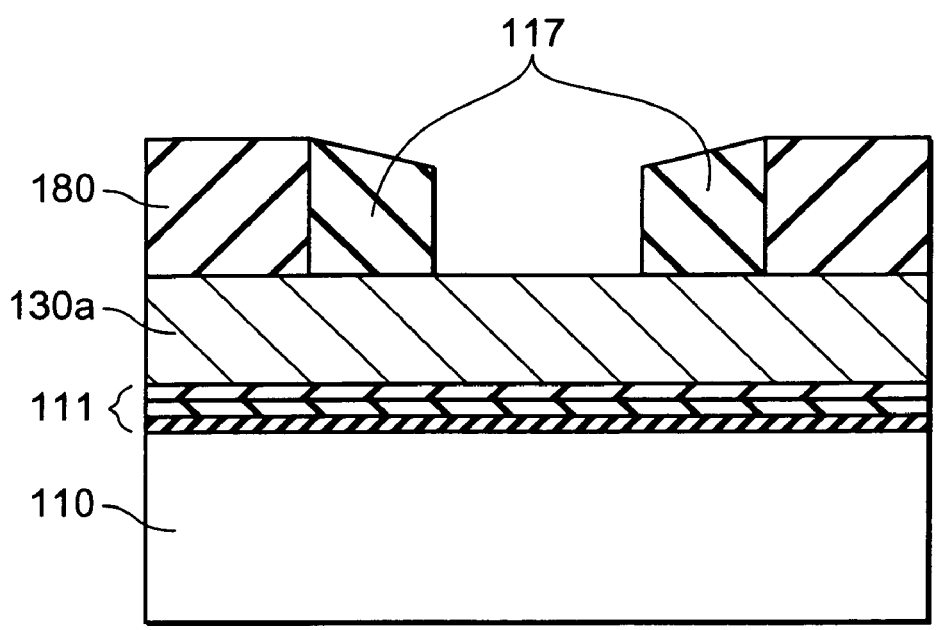
FIG. 4 is a cross-sectional view showing a manufacturing method of JP-A-2004-312009.
Figure 5:
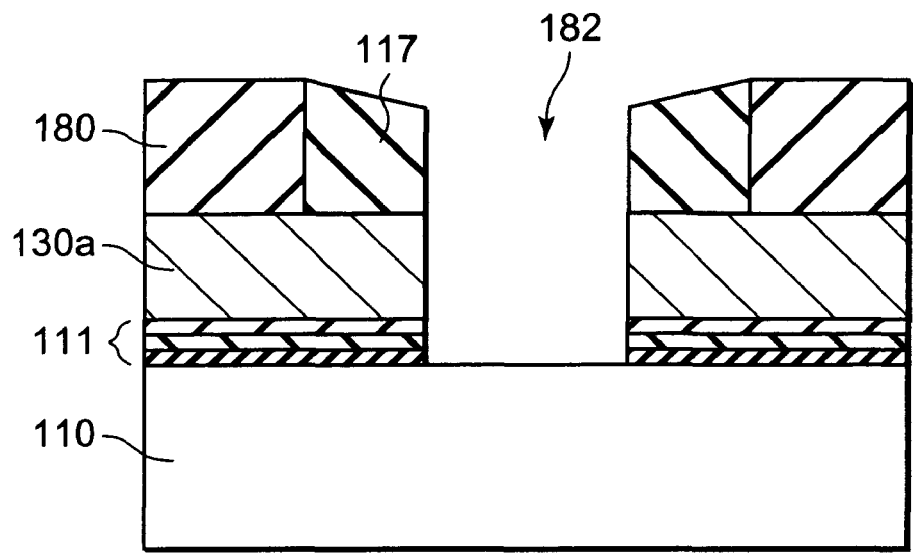
FIG. 5 is a cross-sectional view showing a manufacturing method of JP-A-2004-312009.
Figure 6:
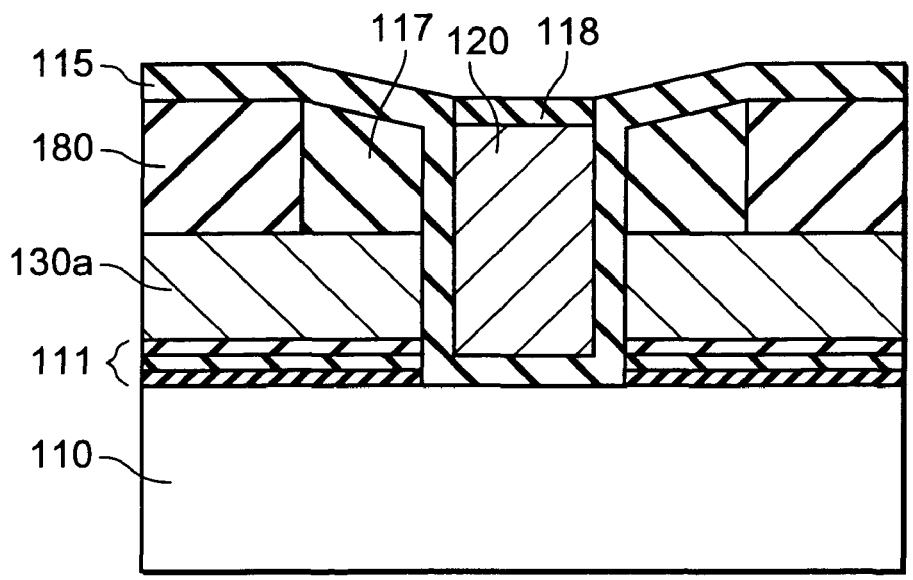
FIG. 6 is a cross-sectional view showing a manufacturing method of JP-A-2004-312009.
Figure 7:
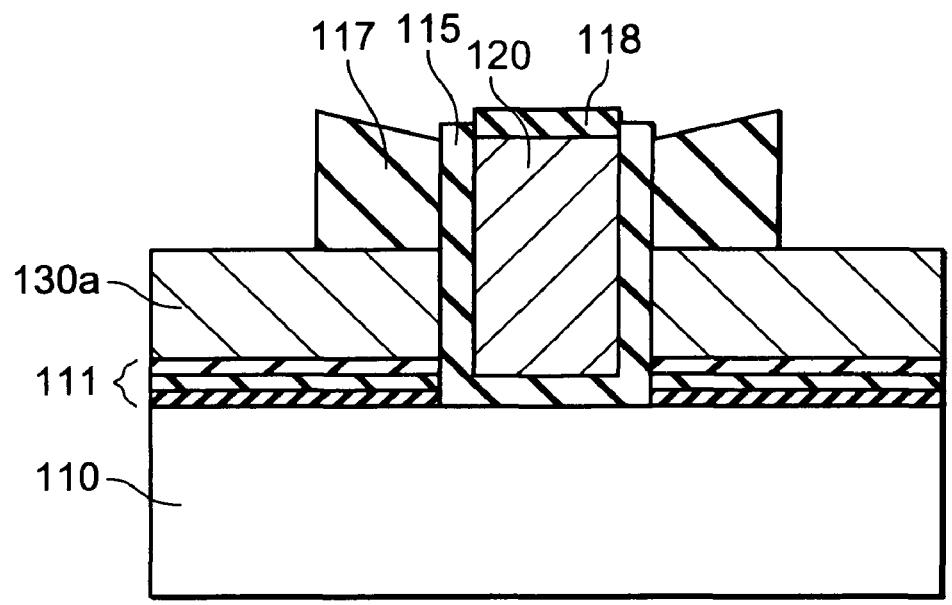
FIG. 7 is a cross-sectional view showing a manufacturing method of JP-A-2004-312009.
Figure 8:
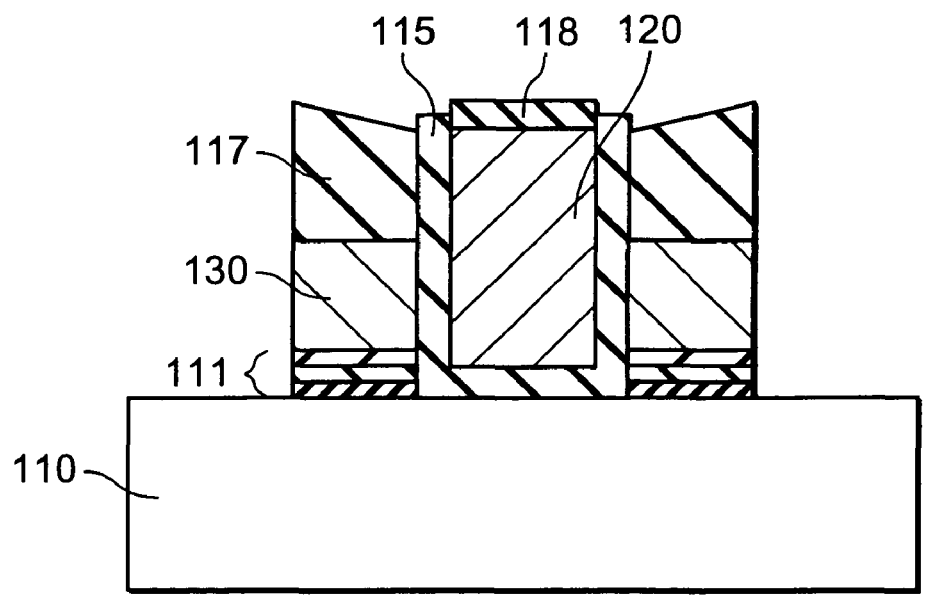
FIG. 8 is a cross-sectional view showing a manufacturing method of JP-A-2004-312009.
Figure 9:
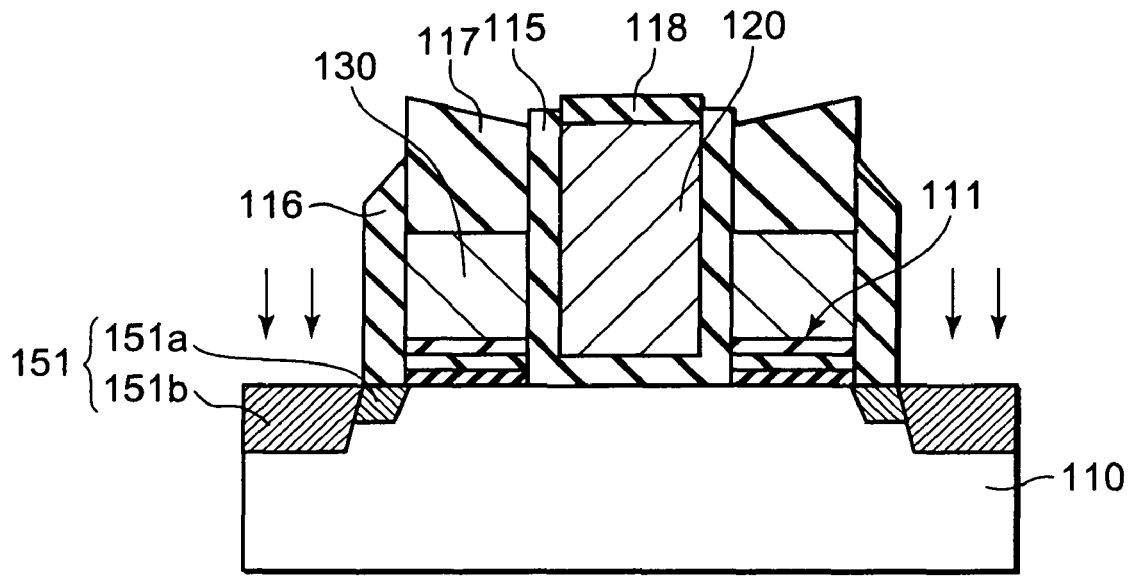
FIG. 9 is a cross-sectional view showing a manufacturing method of JP-A-2004-312009.
Figure 10:
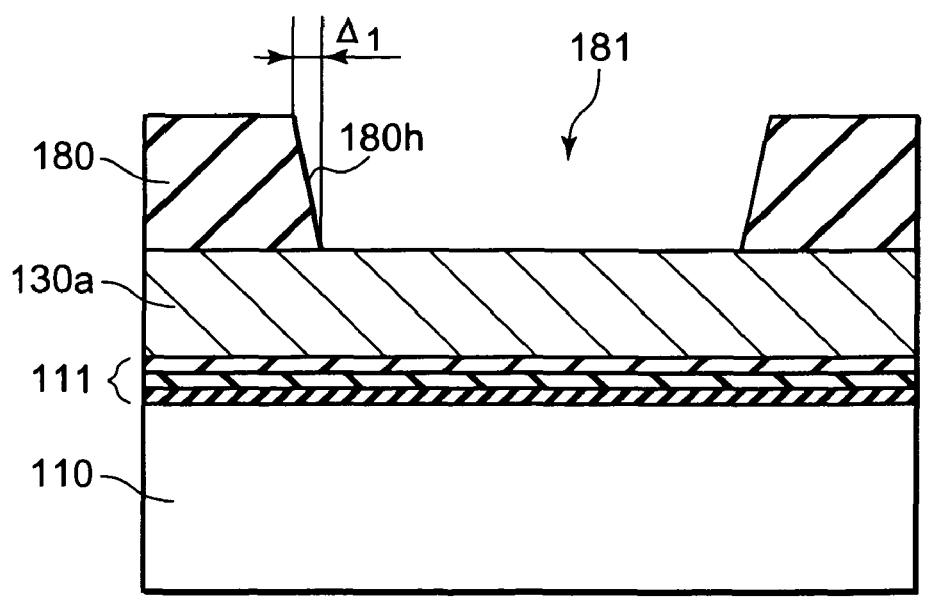
FIG. 10 is a cross-sectional view for explaining problems of the technique of JP-A-2004-312009.
Figure 11:
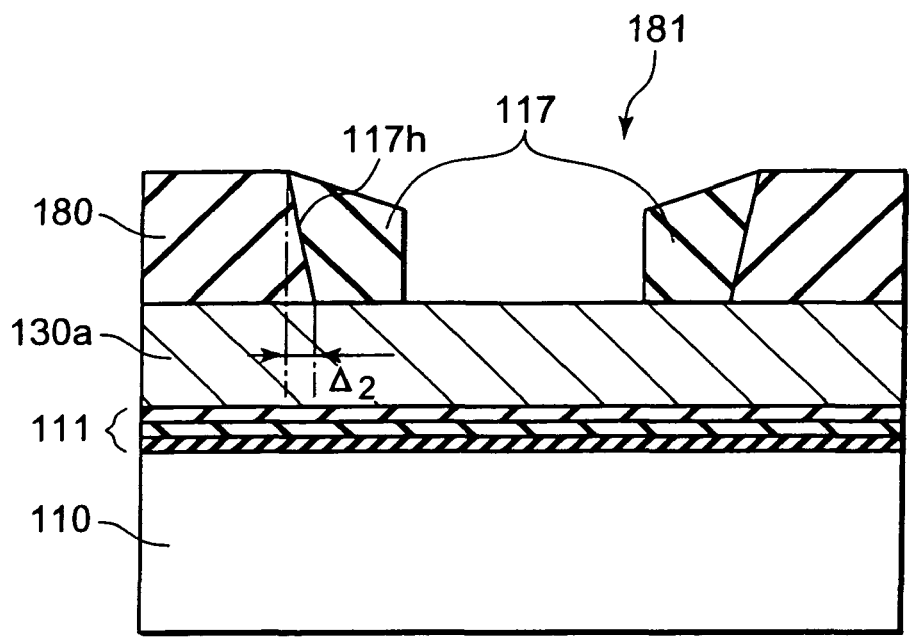
FIG. 11 is a cross-sectional view for explaining problems of the technique of JP-A-2004-312009.

Also, in the technique of JP-A-2004-312009, in order to form the control gate electrode 130, it is necessary to execute selective etching by the aid of at least three kinds of insulating films that can provide etching selectivity as the buffer layer 180, the first insulating spacer 117, and the gate dielectric layer 115 in the processes of FIGS. 6 and 7. However, it is difficult to select the above insulating films in a normal silicon process. However, in the first exemplary embodiment, in order to form the control gate electrode 30, for example, it is possible to execute selective etching by the aid of two kinds of insulating films that can provide etching selectivity, such as the oxide film 82 on the word gate electrode 20, the word gate insulating film 15 (silicon oxide), and the spacer layer 17 (silicon oxide) in the processes of FIGS. 22 and 23. That is, the first exemplary embodiment can be readily realized in a normal silicon process.

Second Exemplary Embodiment

Figure 35:
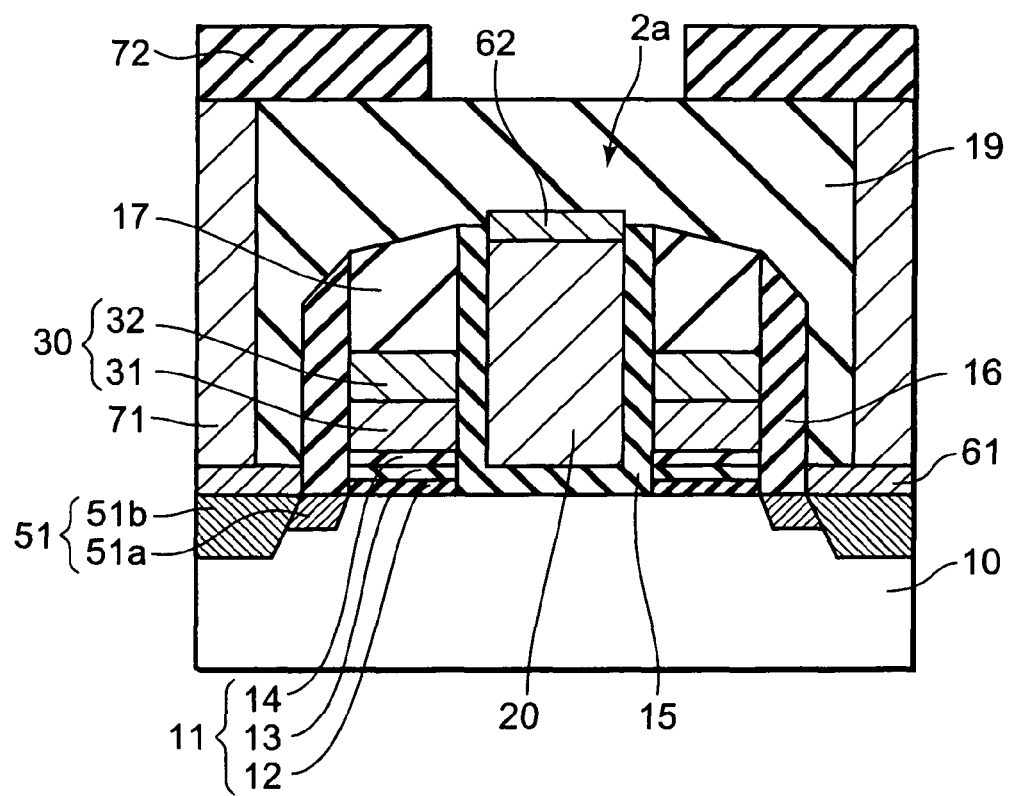
FIG. 35 is a cross-sectional view showing the configuration of a nonvolatile semiconductor storage device according to an exemplary second embodiment of the present invention.

First, a description will be given of the configuration of the nonvolatile semiconductor storage device according to the second exemplary embodiment of the present invention. FIG. 35 is a cross-sectional view showing the configuration of the nonvolatile semiconductor storage device according to the second exemplary embodiment of the present invention. FIG. 35 exemplifies a flash memory cell with a MONOS structure as a memory cell 2a of the nonvolatile semiconductor storage device according to the second exemplary embodiment.

The memory cell 2a differs from that in the first exemplary embodiment in that the control gate electrode 30 has a two-layer structure (polycide structure) including of the control gate layer 31 and the silicide layer 32. That is, the control gate electrode 30 is formed on both side surfaces of the word gate electrode 20 through the word gate insulating film 15, and on the channel region through the ONO film 111. The control gate electrode 30 includes the control gate layer 31 being a lower layer disposed on the ONO film 11, and the silicide layer 32 disposed between the control gate layer 31 and the spacer layer 17. The control gate layer 31 is exemplified by polysilicon doped with impurities, and the silicide layer 32 is exemplified by tungsten silicide. The top surface of the control gate layer 31 is substantially parallel to the flat surface of the semiconductor substrate 10, and flat. In the TWIN-MONOS structure shown in FIG. 35, each of the memory cells 2 has two control gate electrodes 30 at both sides of one word gate electrode 20.

Other configurations (including FIG. 14) and operation are identical with those in the first exemplary embodiment, and therefore their description will be omitted.

Subsequently, a description will be given of a method of manufacturing the nonvolatile semiconductor storage device according to the second exemplary embodiment. FIGS. 36 to 44 are cross-sectional views showing respective processes in the method of manufacturing the nonvolatile semiconductor storage device according to the second exemplary embodiment. FIGS. 36 to 44 correspond to a cross section taken along a line A-A' in FIG. 14. Hereinafter, a description will be given of an example in which the word gate electrode 20 is formed of a polysilicon film and the control gate electrodes 30 are formed of a polysilicon film and a tungsten silicide film, respectively.

Figure 36:
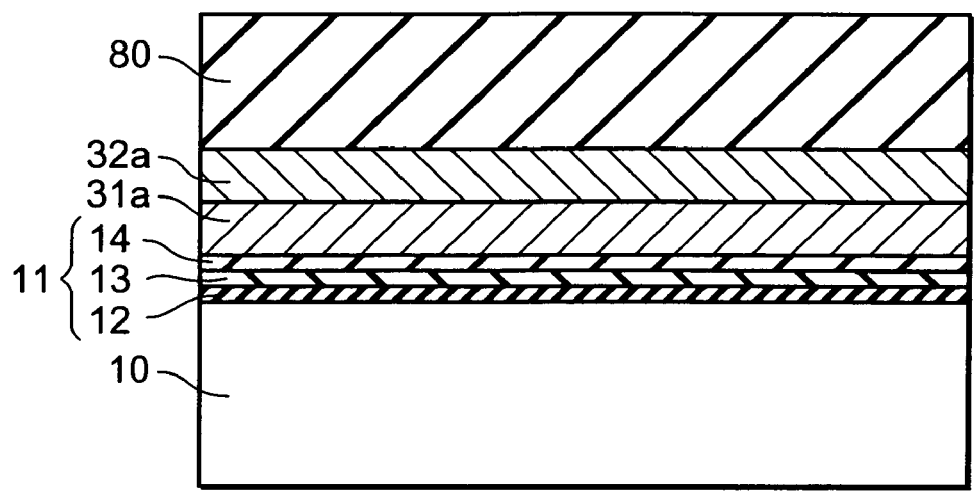
FIG. 36 is a cross-sectional view showing a manufacturing method for the nonvolatile semiconductor storage device according to the second exemplary embodiment of the present invention.

As shown in FIG. 36, on the surface of the semiconductor substrate 10 made of the p-type silicon are laminated a silicon oxide film as the oxide film 12, a silicon nitride film as the nitride film 13, and a silicon oxide film as the oxide film 14 in the stated order. The first silicon oxide film is formed in, for example, a thickness of about 3 to 5 nm through a wet oxidizing method or a radical oxidizing method. The silicon nitride film is formed in, for example, a thickness of about 6 to 10 nm through a CVD method. The last silicon oxide film is formed in, for example, a thickness of about 3 to 10 nm through the radical oxidizing, the wet oxidizing or CVD method. As a result, the ONO film 11 functioning as the charge storage layer is formed. Thereafter, the polysilicon film 30a is formed so as to cover the ONO film 11 through the CVD method. The polysilicon film 31a is formed in, for example, a thickness of about 25 to 100 nm, and doped with In-Situ impurities contained in the film or doped with impurities by ion implantation after the film has been formed. The polysilicon film 30a forms the control gate electrodes 31 in a post-process. Then, a tungsten silicide film 32a is formed through the CVD method so as to cover the polysilicon film 31a. The tungsten silicide film 32a is formed in, for example, a thickness of about 25 to 100 nm. The tungsten silicide film 32a forms the silicide layer 32 in a post-process. Thereafter, the silicon nitride film is formed as the mask film 80 so as to cover the tungsten silicide film 32a. The mask film 80 is formed in, for example, a thickness of about 50 to 200 nm.

Figure 37:
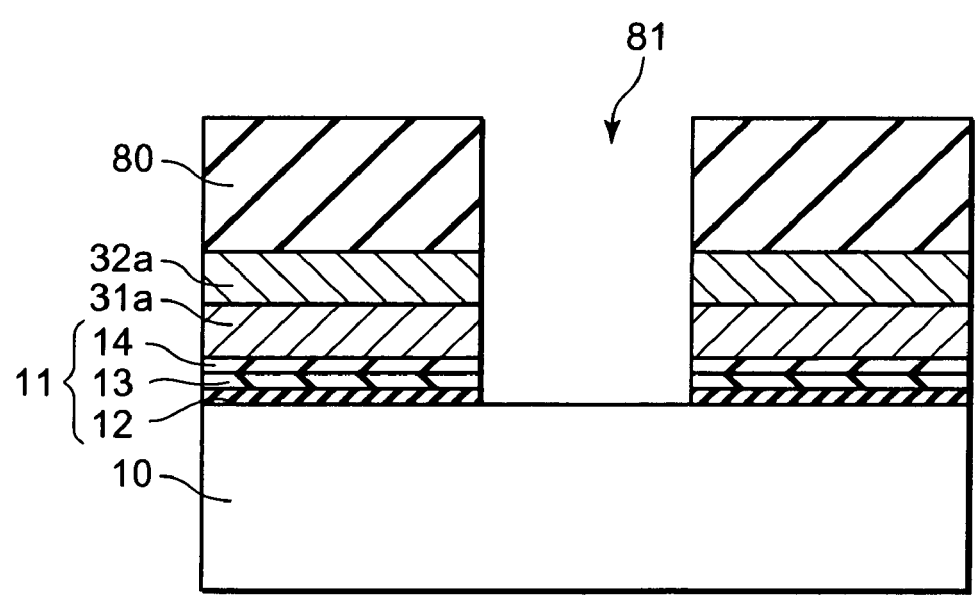
FIG. 37 is a cross-sectional view showing a manufacturing method for the nonvolatile semiconductor storage device according to the second exemplary embodiment of the present invention.

Then, as shown in FIG. 37, a photo resist (not shown) having a pattern of the word gate electrode 20 is formed through a photolithography technique. Then, the mask film 80, the tungsten silicide film 32a, the polysilicon film 31a, and the ONO film 11 are sequentially dry-etched with the photo resist as a mask to form the trench 81. The word gate electrode 20 is formed within the trench 81 in a post-process. Thereafter, the photo resist is removed.

Figure 38:
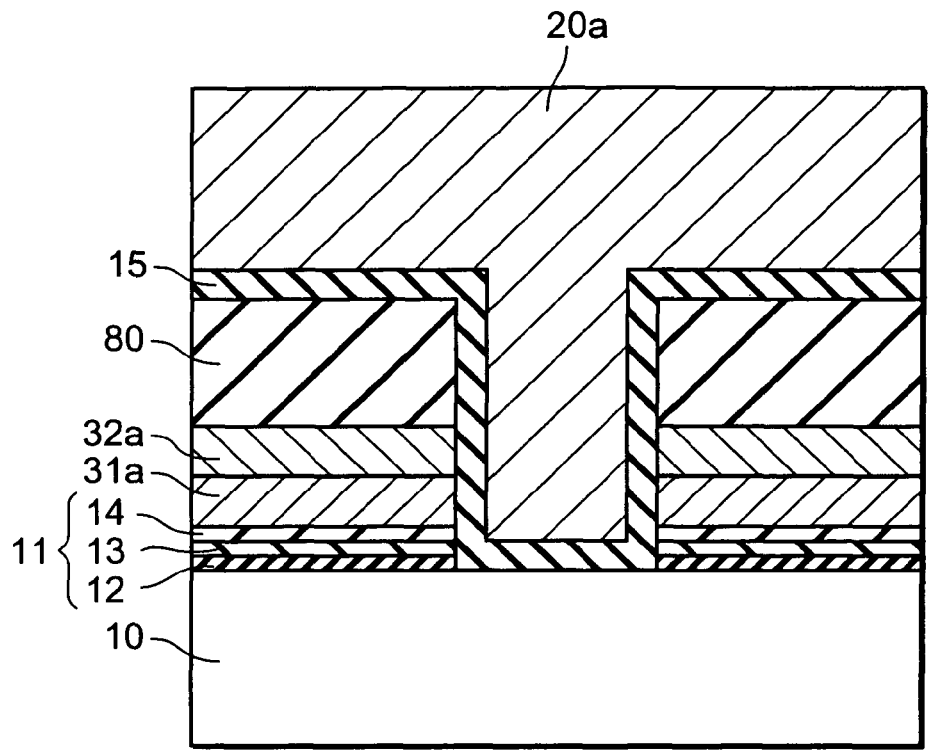
FIG. 38 is a cross-sectional view showing a manufacturing method for the nonvolatile semiconductor storage device according to the second exemplary embodiment of the present invention.

Subsequently, as shown in FIG. 38, the word gate insulating film 15 is formed through the CVD method so as to cover the inside of the mask film 80 and the trench 81. The word gate insulating film 15 is formed in, for example, 10 to 30 nm. A width of the trench 81 after the word gate insulating film 15 has been formed corresponds to a gate length of the word gate electrode 20. For example, the width is about 60 to 200 nm. Then, the polysilicon film 20a is formed through the CVD method so as to cover the word gate insulating film 15 and fill in the trench 81. The polysilicon film 20a is formed in, for example, a thickness of about 60 to 200 nm, and then doped with In-Situ impurities contained in the film or doped with impurities by ion implantation after the film has been formed. The polysilicon film 20a forms the word gate electrodes 20 in a post-process.

Figure 39:
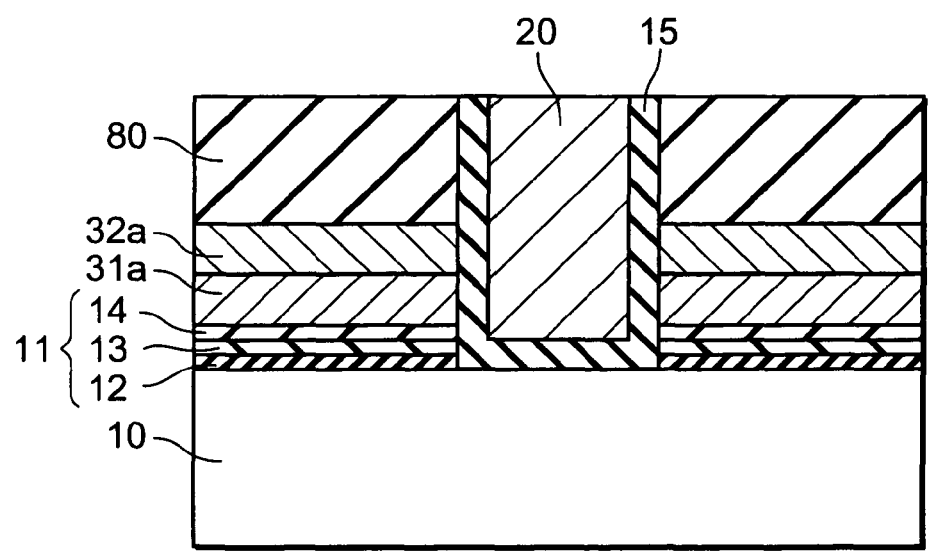
FIG. 39 is a cross-sectional view showing a manufacturing method for the nonvolatile semiconductor storage device according to the second exemplary embodiment of the present invention.
Figure 40:
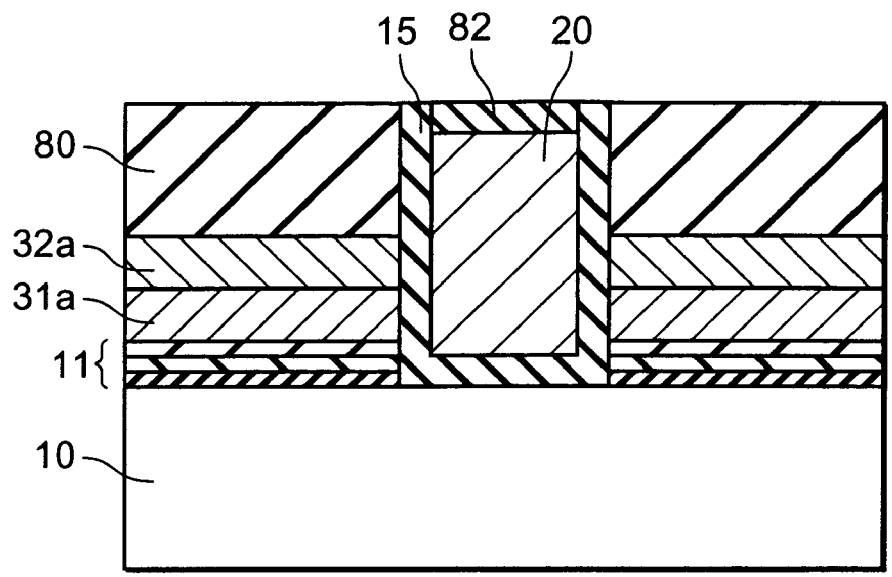
FIG. 40 is a cross-sectional view showing a manufacturing method for the nonvolatile semiconductor storage device according to the second exemplary embodiment of the present invention.
Figure 41:
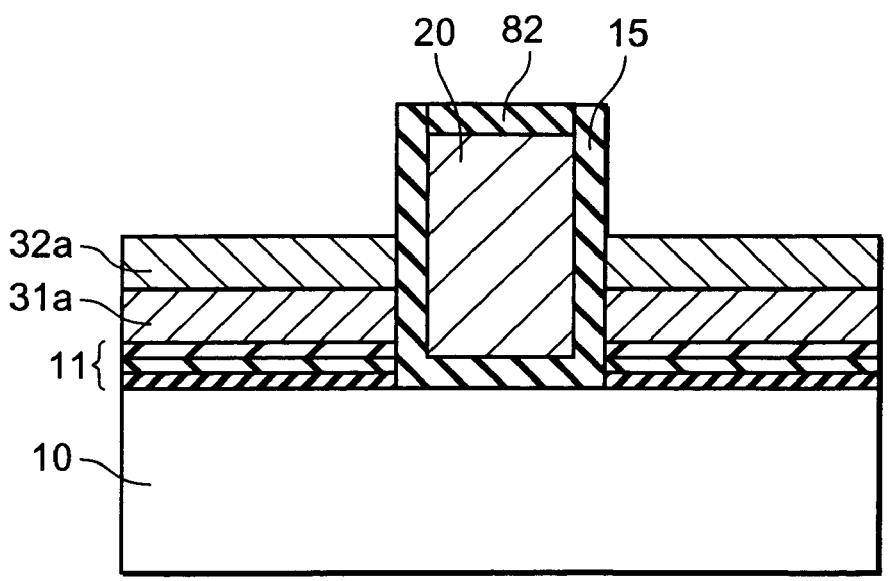
FIG. 41 is a cross-sectional view showing a manufacturing method for the nonvolatile semiconductor storage device according to the second exemplary embodiment of the present invention.

Then, as shown in FIG. 39, the polysilicon film 20a and the word gate insulating film 15 are removed and planarized through etch back or CMP so as to be adjusted to the height of the mask film 80 (remain only within the trench 81). As a result, the polysilicon film 20a forms the word gate electrode 20. Subsequently, as shown in FIG. 40, the upper portion of the word gate electrode 20 is thermally oxidized to form the oxide film 82 in, for example, a thickness of about 10 to 50 nm. Thereafter, as shown in FIG. 41, the mask film 80 is removed by etching. As a result, the upper portion of the word gate electrode 20 whose sides are covered with the word gate insulating film 15 and whose top surface is covered with the oxide film 82 projects from the surface of the tungsten silicide film 32a.

Figure 42:
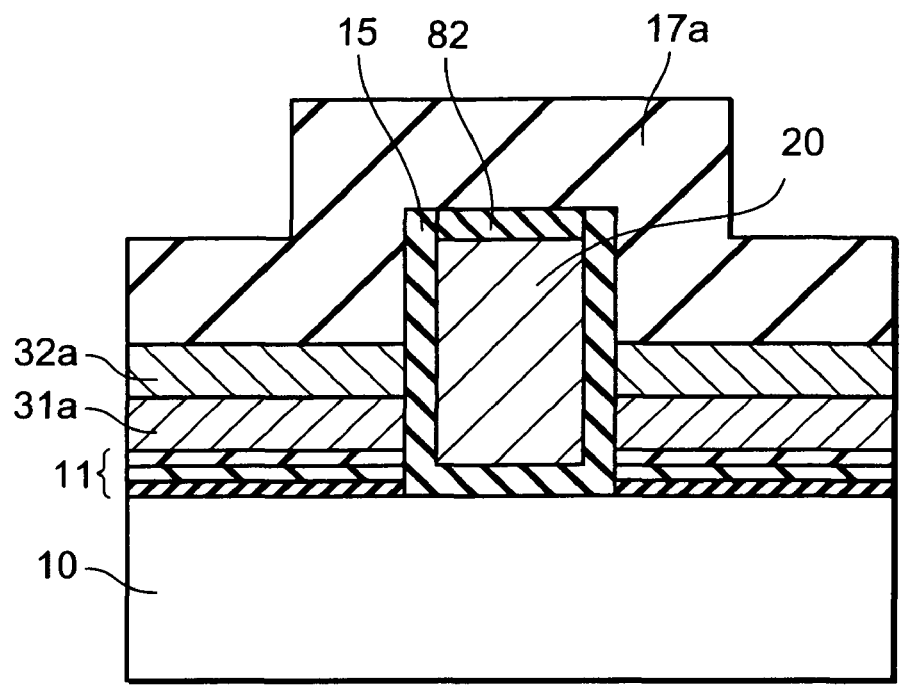
FIG. 42 is a cross-sectional view showing a manufacturing method for the nonvolatile semiconductor storage device according to the second exemplary embodiment of the present invention.
Figure 43:
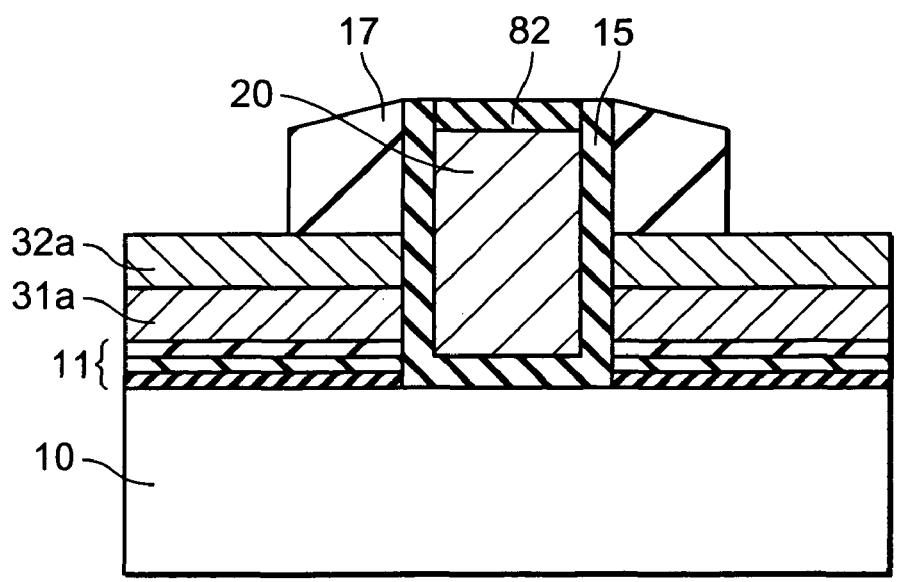
FIG. 43 is a cross-sectional view showing a manufacturing method for the nonvolatile semiconductor storage device according to the second exemplary embodiment of the present invention.
Figure 44:
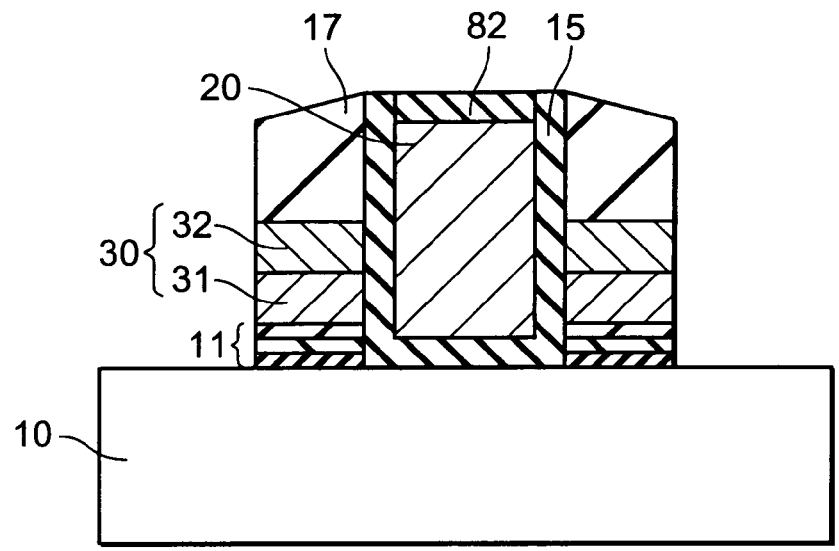
FIG. 44 is a cross-sectional view showing a manufacturing method for the nonvolatile semiconductor storage device according to the second exemplary embodiment of the present invention.

Subsequently, as shown in FIG. 42, a silicon nitride film is formed as a spacer film 17a in, for example, a thickness of about 30 to 100 nm through the CVD method so as to cover the word gate electrode 20 covered with the word gate insulating film 15 and the nitride film 82, and the polysilicon film 30a. Thereafter, as shown in FIG. 43, the spacer film 17a is etched back. As a result, a spacer 17 is formed on the side surface of the word gate electrode 20 through the word gate insulating film 15, and on the surface of the tungsten silicide film 32a. Then, as shown in FIG. 44, the tungsten silicide film 32a, the polysilicon film 31a, and the ONO film 11 are sequentially etched with the spacer layer 17 as a mask. As a result, the control gate electrode 30 (the control gate layer 31 and the silicide layer 32) is formed. The surface of the semiconductor substrate 10 is exposed outside of the control gate electrode 30. At this time, a width of the spacer layer 17 becomes a gate length of the control gate electrode 30.

The subsequent processes are identical with those in FIGS. 24 to 28 in the first exemplary embodiment, and therefore their description will be omitted. With the above operation, the nonvolatile semiconductor storage device (FIG. 35) according to the second exemplary embodiment is manufactured.

Similarly, in the second exemplary embodiment, the same advantages as those in the first exemplary embodiment can be obtained. Also, in the second exemplary embodiment, the control gate electrode 30 has a two-layer structure (the polycide structure of polysilicon and silicide) including the control gate layer 31 and the silicide layer 32. For that reason, the control gate electrode 30 can be reduced in resistance, thereby enabling high-speed operation to be realized.

Third Exemplary Embodiment

Figure 45:
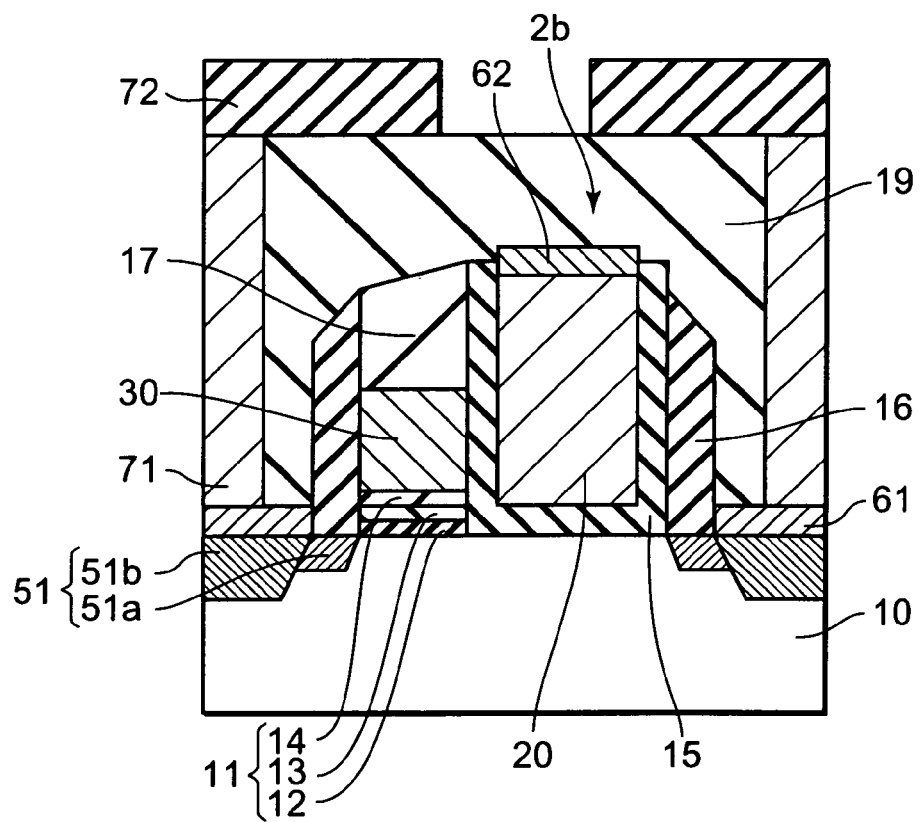
FIG. 45 is a cross-sectional view showing the configuration of a nonvolatile semiconductor storage device according to a third exemplary embodiment of the present invention.
Figure 46:
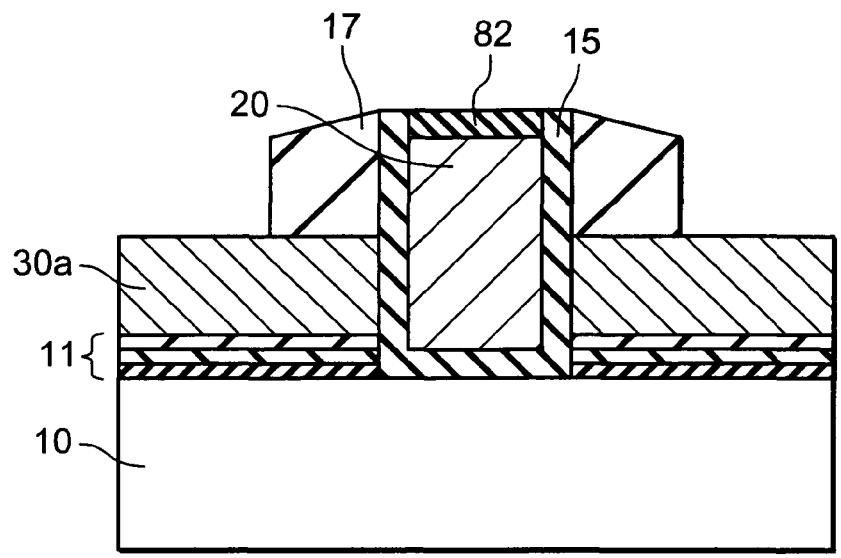
FIG. 46 is a cross-sectional view showing the respective processes in the manufacturing method for the nonvolatile semiconductor storage device according to the third exemplary embodiment of the present invention.

First, a description will be given of the configuration of a nonvolatile semiconductor storage device according to a third exemplary embodiment of the present invention. FIG. 45 is a cross-sectional view showing the configuration of the nonvolatile semiconductor storage device according to the third exemplary embodiment of the present invention. FIG. 45 exemplifies a flash memory cell with a MONOS structure as a memory cell 2b of the nonvolatile semiconductor storage device according to the third exemplary embodiment.

The memory cell 2b differs from that in the first exemplary embodiment in that the control gate electrode 30 is disposed at only one side of the word gate electrode 20. Other configurations (including FIG. 14) and operation are identical with those in the first exemplary embodiment, and therefore their description will be omitted.

Subsequently, a description will be given of a method of manufacturing the nonvolatile semiconductor storage device according to the third exemplary embodiment. FIGS. 46 to 53 are cross-sectional views showing respective processes in the method of manufacturing the nonvolatile semiconductor storage device according to the third exemplary embodiment. FIGS. 46 to 53 correspond to a cross section taken along a line A-A' in FIG. 14. Hereinafter, a description will be given of an example in which the word gate electrode 20 and the control gate electrode 30 are formed of a polysilicon film.

Figure 47:
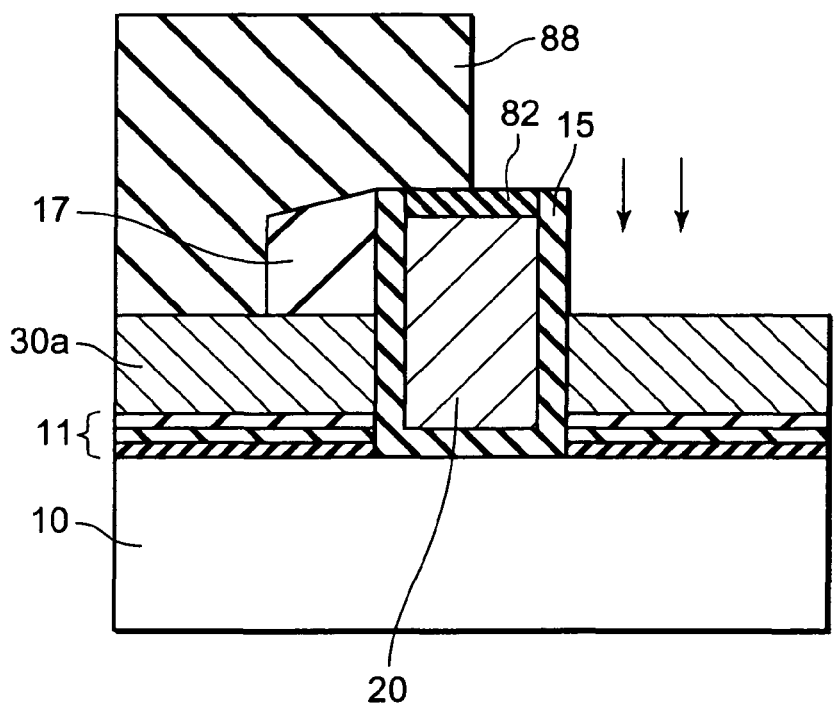
FIG. 47 is a cross-sectional view showing the respective processes in the manufacturing method for the nonvolatile semiconductor storage device according to the third exemplary embodiment of the present invention.

Initial processes of the manufacturing method for the nonvolatile semiconductor storage device according to the third exemplary embodiment are identical with the processes in FIGS. 15 to 22 in the first exemplary embodiment, and, therefore their description will be omitted. The results of those processes become a state shown in FIG. 46 (as in FIG. 22), Then, as shown in FIG. 47, a photo resist 88 covering only one side of the word gate electrode 20 is formed through a photolithography technique. Then, the spacer layer 17 at one side of the word gate electrode 20 is removed with the photo resist 88 as a mask. Thereafter, the photo resist 88 is removed.

Figure 48:
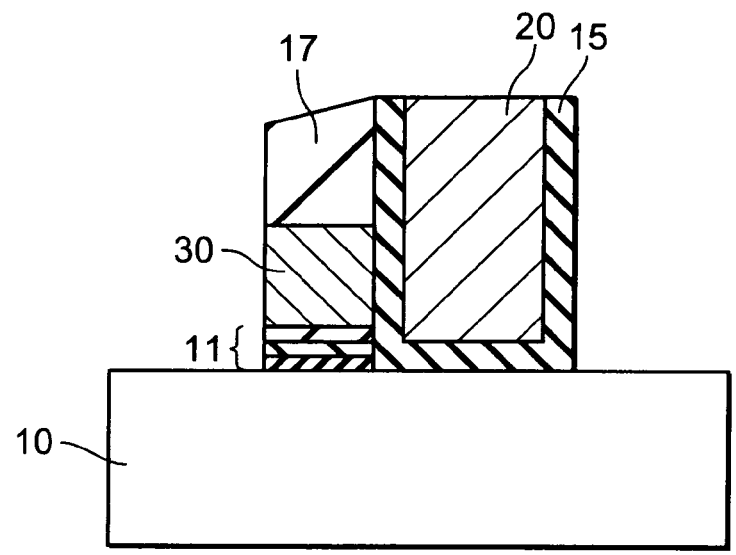
FIG. 48 is a cross-sectional view showing the respective processes in the manufacturing method for the nonvolatile semiconductor storage device according to the third exemplary embodiment of the present invention.

Subsequently, as shown in FIG. 48, the polysilicon film 30a and the ONO film 11 are sequentially etched with the spacer layer 17 as a mask. As a result, the control gate electrode 30 is formed at one side of the word gate electrode 20. The surface of the semiconductor substrate 10 is exposed to the outside of the control gate electrode 30 and one side of the word gate electrode 20. In this case, the width of the spacer layer 17 becomes the gate length of the control gate electrode 30.

Figure 49:
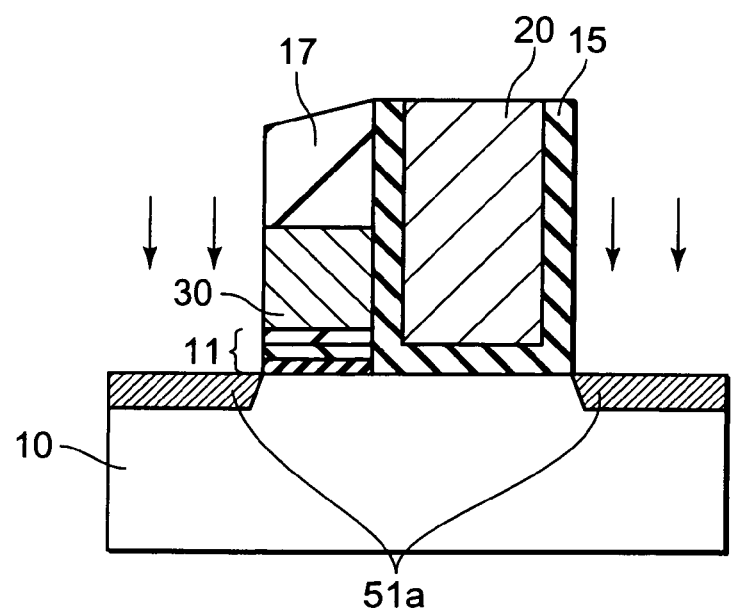
FIG. 49 is a cross-sectional view showing the respective processes in the manufacturing method for the nonvolatile semiconductor storage device according to the third exemplary embodiment of the present invention.
Figure 50:
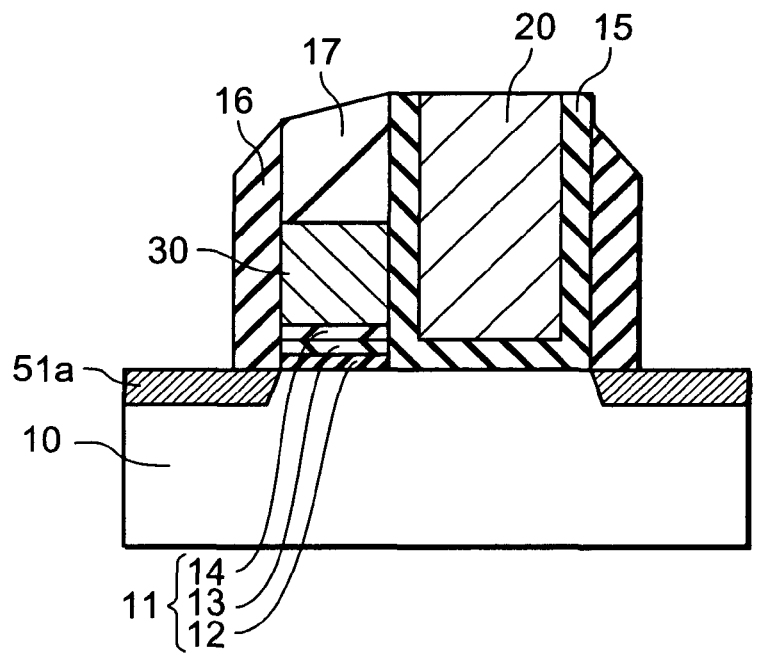
FIG. 50 is a cross-sectional view showing the respective processes in the manufacturing method for the nonvolatile semiconductor storage device according to the third exemplary embodiment of the present invention.
Figure 51:
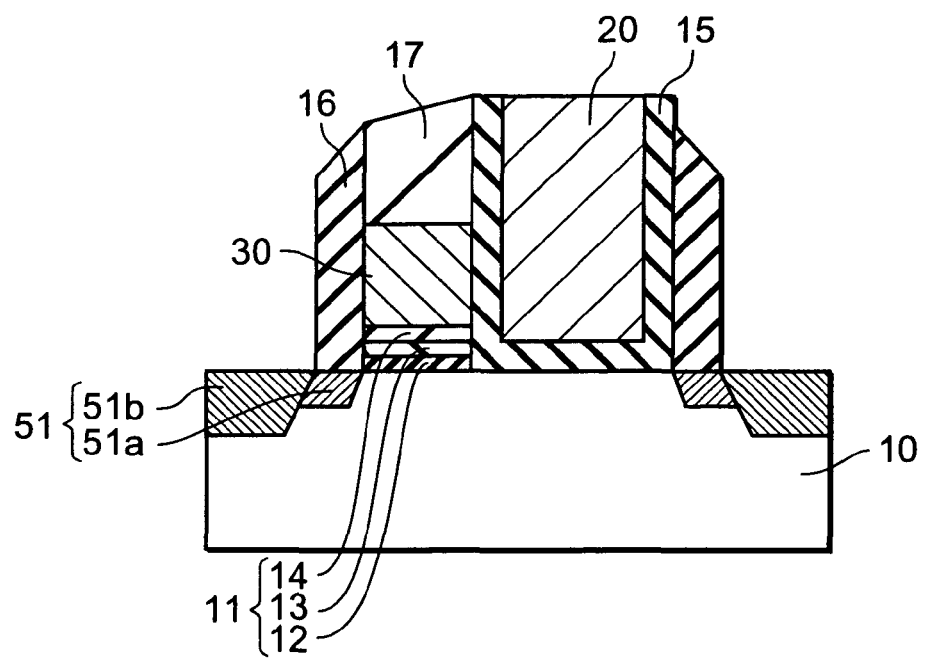
FIG. 51 is a cross-sectional view showing the respective processes in the manufacturing method for the nonvolatile semiconductor storage device according to the third exemplary embodiment of the present invention.

Then, as shown in FIG. 49, impurities are implanted into the surface region of the semiconductor substrate 10 with the spacer layer 17, the word gate electrode 20, and the word gate insulating film 15 as a mask to form a low-concentration diffusion layer 51a. Then, as shown in FIG. 50, a silicon oxide film is formed on the entire surface through the CVD method, and etched back to form a side wall insulating film 16 on the side surfaces of the spacer 15, layer 17, the control gate electrode 30, and the ONO film 11 and on the side surface of the word gate insulating film 15. Thereafter, as shown in FIG. 51, impurities are implanted into the surface region of the semiconductor substrate 10 with the side wall insulating film 16, the spacer layer 17, the word gate electrode 20, and the word gate insulating film 15 as a mask, to form a high-concentration diffusion layer 51b. The low-concentration diffusion layer 51a and the high-concentration diffusion layer 51b constitute the source/drain diffusion layer 51.

Figure 52:
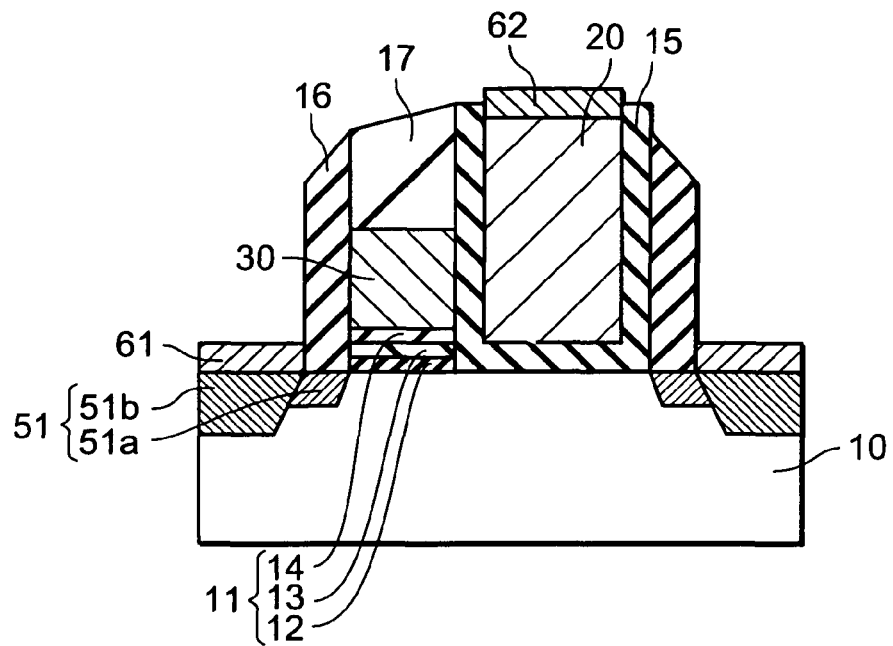
FIG. 52 is a cross-sectional view showing the respective processes in the manufacturing method for the nonvolatile semiconductor storage device according to the third exemplary embodiment of the present invention.
Figure 53:
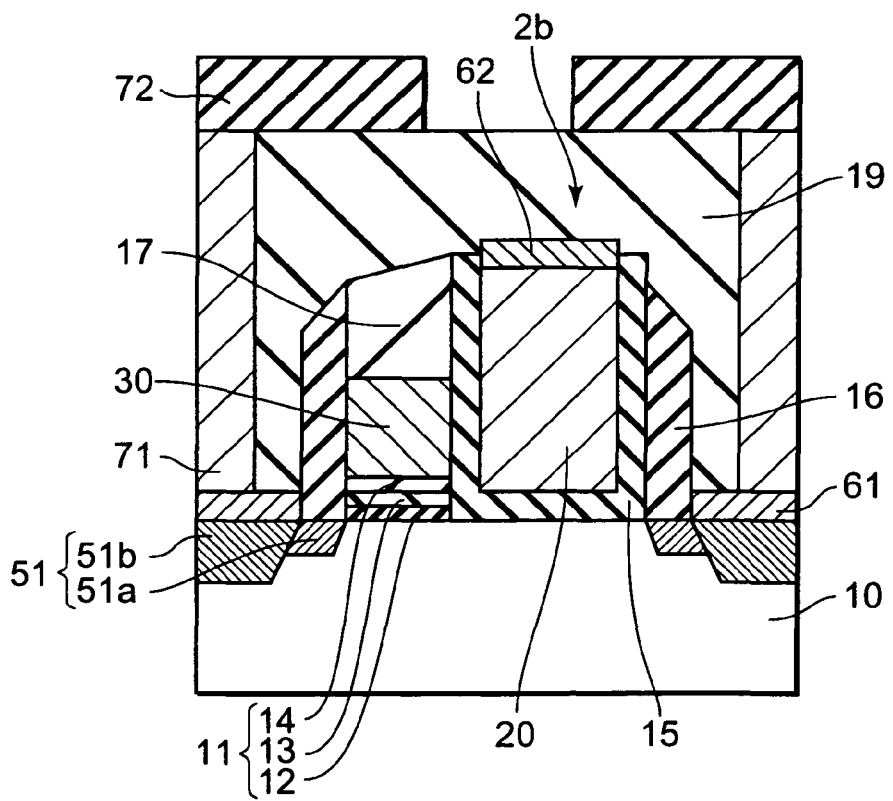
FIG. 53 is a cross-sectional view showing the respective processes in the manufacturing method for the nonvolatile semiconductor storage device according to the third exemplary embodiment of the present invention.

Then, as shown in FIG. 52, a metal film exemplified by cobalt is formed on the entire surface through the sputtering method to form the silicide layers 62 and 61 on the word gate electrode 20 and the source/drain diffusion layer 51 through a given heat treatment, respectively. Then, as shown in FIG. 53, after the formation of the interlayer insulating layer 19 on the entire surface, the contact 71 that penetrates the interlayer insulating layer 19 is formed on the source/drain diffusion layer to form a wiring 72 on the contact 71.

With the above operation, the nonvolatile semiconductor storage device (FIG. 45) according to the third exemplary embodiment is manufactured.

Figure 54:
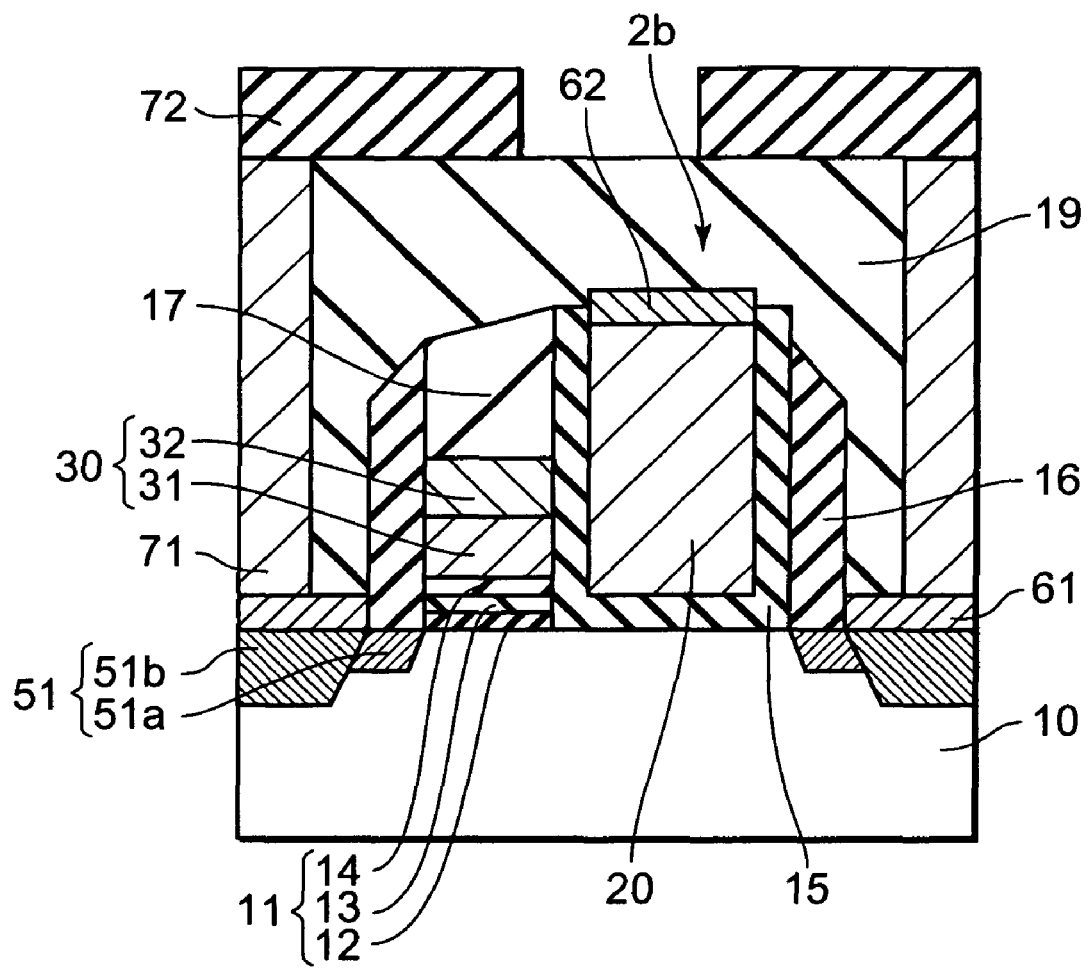
FIG. 54 is a cross-section view showing a modification of the exemplary second embodiment.

Likewise, in the third exemplary embodiment, the same advantages as those in the first exemplary embodiment can be obtained. Also, in the third exemplary embodiment, since there is applied the configuration of one bit/one cell system suitable for the high speed operation in which the control gate electrode 30 is disposed at only one side of the word gate electrode 20, the high speed operation and the miniaturization of the cell size can be performed. Further, when the configuration of the third exemplary embodiment in which the control gate electrode 30 is disposed at only one side of the word gate electrode 20 is applied to the configuration of the second exemplary embodiment, still higher speed operation can be executed (FIG. 54).

Although the invention has been described above in connection with several exemplary embodiments thereof, it will be appreciated by those skilled in the art that those embodiments are provided solely for illustrating the invention, and should not be relied upon to construe the appended claims in a limiting sense.

Further, it is noted that, notwithstanding any claim amendments made hereafter, applicant's intent is to encompass equivalents all claim elements, even if amended later during prosecution.

It is apparent to one skilled in the art that the present invention may be changed or modified without departing from the spirit and scope of the apparatus claims that are indicated in the subsequent pages as well as methods that are indicated below.

AA. A method for manufacturing a nonvolatile semiconductor storage device, comprising:
sequentially forming a charge storage layer, a conductive layer, and a mask layer above a semiconductor substrate;
sequentially removing the mask layer, the conductive layer, and the charge storage layer to form a trench;
covering an inside of the trench with an insulating layer;
forming a word gate so as to fill in the trench whose inside is covered with the insulating layer;
removing the mask layer;
forming a spacer layer so as to cover the conductive layer and the word gate;
etching the spacer layer to form a sidewall spacer above a side of the word gate via the insulating layer; and
removing the conductive layer and the charge storage layer with the sidewall spacer as a mask to form a control gate.

BB. The method according to method AA, wherein the forming of the charge storage layer, the conductive layer and the mask layer comprises forming a silicide layer on the conductive layer.

CC. The method according to method AA, wherein the charge storage layer includes a laminated layer of a first silicon oxide layer, a silicon nitride layer and a second silicon oxide layer.

DD. The method according to method AA, further comprising removing one of the spacer layers formed on both sides of the word gate before the removing the conductive layer and the charge storage layer.

EE. The method according to method AA, further comprising implanting an ion to form a diffusion layer and a second diffusion layer on the semiconductor substrate,
wherein the charge storage layer and the word gate are disposed between the first diffusion layer and the second diffusion layer.

FF. The method according to method AA, wherein a top surface of the spacer layer is lower as the top surface of the spacer layer is farther from the word gate.

GG. The method according to method AA, wherein a width of the spacer layer is narrower as the width of the spacer layer is farther from the control gate.

HH. The method according to method AA, wherein a height of the spacer layer from a top surface of the control gate is lower as the top surface of the spacer layer is farther from the word gate.

What is claimed is:

1. A method of manufacturing a nonvolatile semiconductor storage device, said method comprising:
   sequentially forming a charge storage film, a conductive film, and a mask film on a semiconductor substrate;
   sequentially removing the mask film, the conductive film, and the charge storage film at a given portion to form a groove;
   forming a word gate electrode to fill in the groove whose inside is covered with an insulating film;
   after said forming the word gate electrode, removing the mask film;
   after said removing the mask film, forming a spacer film to cover the conductive film and the word gate electrode;
   etching back the spacer film to form a spacer layer on both sides of the word gate electrode through the insulating film;
   removing the conductive film and the charge storage film to form a control gate electrode; and
   forming a source drain diffusion layer.

2. The method of claim 1, wherein the charge storage layer includes a laminated film that comprises a silicon oxide film, a silicon nitride film, and a silicon oxide film.

3. The method of claim 1, further comprising:
   removing the spacer layer on one of both sides of the word gate electrode before said forming the control gate electrode.

4. The method of claim 1, wherein in said etching back the spacer film to form the spacer layer, a height of a top surface of the spacer layer, with respect to a bottom surface of the spacer layer, decreases as the top surface of the spacer layer extends farther from the word gate.

5. The method of claim 1, wherein the bottom surface of the spacer layer is located above a top surface of the control gate.

6. The method of claim 1, further comprising:
   after said forming the source drain diffusion layer, siliciding an upper portion of the word gate electrode.

* * * * *